(12) United States Patent
Hosono et al.

(10) Patent No.: US 8,085,576 B2
(45) Date of Patent: Dec. 27, 2011

(54) SEMICONDUCTOR MEMORY DEVICE

(75) Inventors: Koji Hosono, Fujisawa (JP); Hiroshi Maejima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 150 days.

(21) Appl. No.: 12/710,661

(22) Filed: Feb. 23, 2010

(65) Prior Publication Data

US 2010/0214820 A1 Aug. 26, 2010

(30) Foreign Application Priority Data

Feb. 25, 2009 (JP) ................. P2009-042914

(51) Int. Cl.
*G11C 11/00* (2006.01)
(52) U.S. Cl. ....................... 365/148; 365/163
(58) Field of Classification Search .............. 365/148, 365/163, 230.06
See application file for complete search history.

(56) References Cited

U.S. PATENT DOCUMENTS

| | | | |
|---|---|---|---|
| 6,141,241 A | 10/2000 | Ovshinsky et al. | |
| 7,433,222 B2* | 10/2008 | Hosoi et al. | 365/148 |
| 7,542,370 B2* | 6/2009 | Yan et al. | 365/230.06 |
| 7,633,788 B2* | 12/2009 | Choi et al. | 365/148 |
| 7,920,408 B2* | 4/2011 | Azuma et al. | 365/148 |
| 2010/0027317 A1 | 2/2010 | Maejima | |

OTHER PUBLICATIONS

U.S. Appl. No. 12/884,965, filed Sep. 17, 2010, Hosono et al.
U.S. Appl. No. 12/556,272, filed Sep. 9, 2009, Koji Hosono et al.

* cited by examiner

*Primary Examiner* — Anh Phung
(74) *Attorney, Agent, or Firm* — Oblon, Spivak, McClelland, Maier & Neustadt, L.L.P.

(57) ABSTRACT

A semiconductor memory device comprises: a memory cell array having memory cells disposed at a crossing-point of a plurality of first lines and a plurality of second lines and a control circuit configured to apply a first voltage to selected one or more of the first lines, and to apply a second voltage having a value smaller than the first voltage to selected one of the second lines, such that a certain potential difference is applied to selected one or more of the memory cells. The control circuit adjusts the second voltage based on a position of the selected one or more of the memory cells within the memory cell array and a number of the selected one or more of the memory cells on which an operation is simultaneously executed, during application of the potential difference to the selected one or more of the memory cells.

20 Claims, 13 Drawing Sheets

SEMICONDUCTOR MEMORY DEVICE

CROSS REFERENCE TO RELATED APPLICATIONS

This application is based upon and claims the benefit of priority from prior Japanese Patent Application No. 2009-42914, filed on Feb. 25, 2009, the entire contents of which are incorporated herein by reference.

BACKGROUND OF THE INVENTION

1. Field of the Invention

The present invention relates to a semiconductor memory device.

2. Description of the Related Art

In recent years, resistive memory devices utilizing a variable resistor as a memory element are receiving attention as candidates to succeed flash memory. The resistive memory devices herein include resistive RAM (ReRAM), in a narrow sense, that uses a transition metal oxide as a recording layer and stores its resistance states in a non-volatile manner, as well as Phase Change RAM (PCRAM) that uses chalcogenide or the like as a recording layer to utilize the resistance information of crystalline states (conductors) and amorphous states (insulators).

Two kinds of operation modes in memory cells of resistive memory devices are known. In one kind, known as a bipolar type, a high-resistance state and a low-resistance state are set by switching a polarity of an applied voltage. In the other kind, known as a unipolar type, setting of the high-resistance state and the low-resistance state are made possible by controlling a voltage value and a voltage application time, without switching the polarity of the applied voltage.

The unipolar type is preferable for realizing a high-density memory cell array. This is because, in the case of the unipolar type, the cell array can be configured by overlapping a variable resistor and a rectifier such as a diode at crossing-points of bit lines and word lines, without using a transistor. Furthermore, arranging such memory cell arrays three-dimensionally in stacks enables a large capacity to be realized without causing an increase in cell array area (refer to Japanese Unexamined Patent Application Publication (Translation of PCT Application) No. 2002-541613).

In the case of unipolar type ReRAM, write of data to a memory cell is performed by applying for a short time to the variable resistor a certain voltage. As a result, the variable resistor changes from the high-resistance state to the low-resistance state. Hereinafter, this operation to change the variable resistor from the high-resistance state to the low-resistance state is called a setting operation. In contrast, erase of data in a memory cell is performed by applying for a long time to the variable resistor in the low-resistance state subsequent to the setting operation a certain voltage lower than that applied during the setting operation. As a result, the variable resistor changes from the low-resistance state to the high-resistance state. Hereinafter, this operation to change the variable resistor from the low-resistance state to the high-resistance state is called a resetting operation. The memory cell, for example, has the high-resistance state as a stable state (reset state), and, in the case of binary data storage, data write is performed by the setting operation which changes the reset state to the low-resistance state.

In such a semiconductor memory device, there is a need to accurately apply a voltage required in the setting operation and resetting operation of the memory cell.

SUMMARY OF THE INVENTION

A semiconductor memory device in accordance with a first aspect of the present invention comprises: a memory cell array having memory cells disposed at a crossing-point of a plurality of first lines and a plurality of second lines, each of the memory cells being configured by a rectifier and a variable resistor connected in series; and a control circuit configured to apply a first voltage to selected one or more of the first lines, and to apply a second voltage having a value smaller than the first voltage to selected one of the second lines, such that a certain potential difference is applied to selected one or more of the memory cells disposed at respective the crossing-points of the selected one or more of the first lines and the selected one of the second lines, the control circuit adjusting the second voltage based on a position of the selected one or more of the memory cells within the memory cell array and a number of the selected one or more of the memory cells on which an operation is simultaneously executed, during application of the potential difference to the selected one or more of the memory cells.

A semiconductor memory device in accordance with a second aspect of the present invention comprises: a memory cell array having memory cells disposed at a crossing-point of a plurality of first lines and a plurality of second lines, each of the memory cells being configured by a rectifier and a variable resistor connected in series; and a control circuit configured to apply a first voltage to selected one or more of the first lines, and to apply a second voltage having a value smaller than the first voltage to selected one of the second lines, such that a certain potential difference is applied to selected one or more of the memory cells disposed at respective the crossing-points of the selected one or more of the first lines and the selected one of the second lines, the control circuit adjusting the second voltage based on a number of the selected one or more of the memory cells on which an operation is simultaneously executed, during application of the potential difference to the selected one or more of the memory cells.

A semiconductor memory device in accordance with a third aspect of the present invention comprises: a memory cell array having memory cells disposed at a crossing-point of a plurality of first lines and a plurality of second lines, each of the memory cells being configured by a rectifier and a variable resistor connected in series; and a control circuit configured to apply a first voltage to selected one or more of the first lines, and to apply a second voltage having a value smaller than the first voltage to selected one of the second lines, such that a certain potential difference is applied to selected one or more of the memory cells disposed at respective the crossing-points of the selected one or more of the first lines and the selected one of the second lines, the control circuit further comprising a resistance circuit configured to take a resistance value which differs according to a position of the selected one or more of the memory cells within the memory cell array, and the control circuit applying the second voltage to the second lines via the resistance circuit, during application of the potential difference to the selected one or more of the memory cells.

DETAILED DESCRIPTION OF THE EMBODIMENTS

Embodiments of the present invention are now described in detail with reference to the accompanying drawings. A semiconductor memory device described in the present embodiments is a resistive memory device having a three-dimensional memory cell array structure in which memory cell arrays are stacked. However, it goes without saying that this configuration is no more than an example, and that the present invention is not limited to this configuration.

First Embodiment (Configuration of a Semiconductor Memory Device in Accordance with a First Embodiment)

Figure 1:
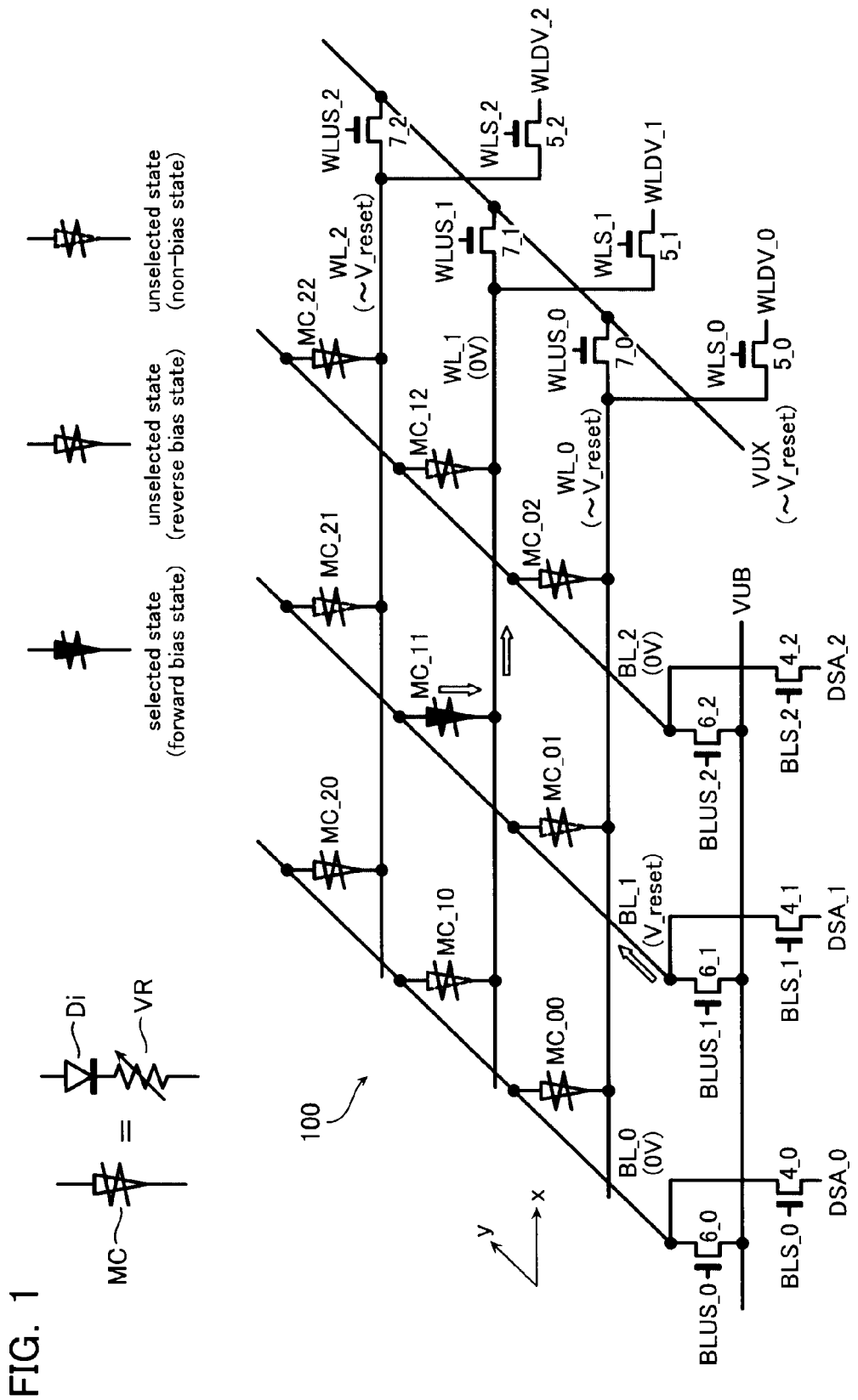
FIG. 1 is a view showing a memory cell array of a resistive memory device in an embodiment of the present invention.

FIG. 1 is a view showing an example of a part of a layout of a memory cell array 100 in a resistive memory device in accordance with a first embodiment of the present invention. As shown in FIG. 1, the resistive memory device of a unipolar type has resistive-type unit memory cells MC disposed at respective crossing-points of mutually-intersecting bit lines BL and word lines WL, the resistive-type unit memory cell MC having a rectifier, for example, a diode Di, and a variable resistor VR connected in series. Here, the bit lines BL are assumed to be signal lines connected to an anode side of the diode Di and the word lines WL are assumed to be signal lines connected to a cathode side of the diode Di. Moreover, the memory cells MC configured by the diode Di and the variable resistor VR connected in series are expressed using symbols shown in the figure. This applies similarly to the example below. Here, a disposition and polarity of the diode Di and variable resistor VR comprising the memory cell MC are likewise not limited to what is shown in the figure. The memory cell array 100 shown in FIG. 1 has, for example, $1\times10^3$ unit memory cells MC disposed respectively in a longitudinal direction of the bit line BL (y direction shown in FIG. 1) and a longitudinal direction of the word line WL (x direction shown in FIG. 1), the unit memory cells MC being arranged in a two-dimensional matrix.

The variable resistor VR is, for example, one having a structure comprising electrode/transition metal oxide/electrode or the like, in which applied conditions of voltage, current, heat and so on cause a resistance of the metal oxide to vary, and stores those differing states of resistance as information in a nonvolatile manner. Utilizable as the variable resistor VR are, more specifically, for example, ones like chalcogenide or the like in which the resistance is varied due to phase transition between a crystalline state and an amorphous state (PCRAM), ones in which the resistance is varied by precipitating metal cations to form a contacting bridge between the electrodes and ionizing the precipitated metal to destroy the contacting bridge (CBRAM: Conductive Bridging RAM), and ones in which the resistance is varied by voltage or current application (broadly divided into ones in which a resistance variation occurs due to presence/absence of a trapped charge in a charge trap existing in an electrode interface and ones in which a resistance variation occurs due to presence/absence of a conductive path induced by oxygen deficiency or the like) (ReRAM).

In the case of unipolar type ReRAM, write of data to the memory cell MC is performed by applying to the variable resistor VR a voltage of, for example, 3.5 V (actually about 4.5 V if a voltage drop portion of the diode Di is included) and a current of about 10 nA for a time of about 10 ns-100 ns. This causes the variable resistor VR to change from the high-resistance state to the low-resistance state (setting operation).

On the other hand, erase of data in the memory cell MC is performed by applying to the variable resistor VR in the low-resistance state subsequent to the setting operation a voltage of 0.8 V (actually about 1.8 V if a voltage drop portion of the diode Di is included) and a current of about 1 µA-10 µA for a time of about 500 ns-2 µs. This causes the variable resistor VR to change from the low-resistance state to the high-resistance state (resetting operation).

A read operation of the memory cell MC is performed by applying to the variable resistor VR a voltage of 0.4 V (actually about 1.4 V if a voltage drop portion of the diode Di is included) and monitoring a current flowing via the variable resistor VR using a sense amplifier. This allows judgement of whether the variable resistor VR is in the high-resistance state or the low-resistance state. Note that, when two bits of data can be stored in one memory cell MC, the sense amplifier generates three different kinds of reference voltages and compares these reference voltages and a cell signal.

Connected to bit lines BL_0-BL_2 in the memory cell array 100 shown in FIG. 1 are NMOS transistors 4 (4_0-4_2) and NMOS transistors 6 (6_0-6_2), respectively. The bit lines BL_0-BL_2 are selected by the transistors 4 and 6, and have a potential thereof controlled. The transistors 4_0-4_2 are respectively connected to signal lines DSA_0-DSA_2 and controlled by signals BLS_0-BLS_2 inputted to gates thereof. Furthermore, the transistors 6_0-6_2 are connected to a signal line VUB and controlled by signals BLUS_0-BLUS_2 inputted to gates thereof.

The signal lines DSA_0-DSA_2 are connected to a sense amplifier and a write control circuit to be described hereafter. The sense amplifier and the write control circuit apply a select bit line voltage to any one of the signal lines DSA_0-DSA_2, and execute the setting and resetting operations, and the read operation on a selected memory cell MC. The signal line VUB is a signal line configured to control a potential applied to an unselected bit line.

Similarly, connected to word lines WL_0-WL_2 are, likewise, NMOS transistors 5 (5_0-5_2) and NMOS transistors 7 (7_0-7_2), respectively. The word lines WL_0-WL_2 are selected by the transistors 5 and 7, and have a potential thereof controlled. The transistors 5_0-5_2 are respectively connected to signal lines WLDV_0-WLDV_2 and controlled by signals WLS_0-WLS_2 inputted to gates thereof. Furthermore, the transistors 7_0-7_2 are connected to a signal line VUX and controlled by signals WLUS_0-WLUS_2 inputted to gates thereof.

Each of the signal lines WLDV_0-WLDV_2 serves as a address signal line. A selected one from among the signal lines WLDV_0-WLDV_2 is provided with a select word line voltage applied from a row decoder. The signal line VUX is a signal line configured to control a potential applied to an unselected word line.

FIG. 1 shows states of applied voltages during a resetting operation when the memory cell MC_11 is selected as the selected memory cell. A selected bit line BL_1 is applied with a selected bit line voltage V_reset supplied from the signal line DSA_1 via the transistor 4_1, and other unselected bit lines BL_0 and BL_2 are applied with an unselected bit line voltage of, for example, 0 V supplied from the signal line VUB via the transistors 6_0 and 6_2.

A selected word line WL_1 is applied with a selected word line voltage of, for example, 0 V supplied from the signal line WLDV_1 via the transistor 5_1, and other unselected word lines WL_0 and WL_2 are applied with an unselected word line voltage V_reset supplied from the signal line VUX via the transistors 7_0 and 7_2.

During operation of the resistive memory device, voltages applied to the bit lines BL and the word lines WL in the memory cell array 100 cause three kinds of voltage-application states to exist in the memory cell MC. The voltage-application states in the memory cell MC are described below taking the resetting operation as an example.

The memory cell MC_11 connected to the crossing-point of the selected bit line BL_1 and the selected word line WL_1 shown in FIG. 1 is hereafter assumed to be in a selected state (forward bias state) and expressed by the symbol in the figure. A reset voltage V_reset is applied to the memory cell MC_11 in the selected state from the selected bit line BL_1 (voltage V_reset) to the selected word line WL_1 (voltage 0 V) in a forward direction of the diode Di. As a result, a potential difference V_reset is applied to the selected memory cell MC_11, whereby the variable resistor VR is changed from the low-resistance state to the high-resistance state, thus completing the resetting operation.

The memory cells MC_01 and MC_21 connected to crossing-points of the selected bit line BL_1 and the unselected word lines WL_0 and WL_2 shown in FIG. 1 are hereafter assumed to be in an unselected state (non-bias state) and expressed by the symbol in the figure. Similarly, the memory cells MC_10 and MC_12 connected to crossing-points of the selected word line WL_1 and the unselected bit lines BL_0 and BL_2 are hereafter likewise assumed to be in the unselected state (non-bias state) and expressed by the symbol in the figure. The same voltage (voltage V_reset) is applied to the unselected word lines WL_0 and WL_2 as to the selected bit line BL_1. Similarly, the same voltage (voltage 0 V) is applied to the unselected bit lines BL_0 and BL_2 as to the selected word line WL_1. As a result, there is no potential difference in the memory cells MC in the unselected state (non-bias state) and no flow of current therein.

The memory cells MC_00, MC_20, MC_02, and MC_22 connected to crossing-points of the unselected word lines WL_0 and WL_2 and the unselected bit lines BL_0 and BL_2 shown in FIG. 1 are hereafter assumed to be in an unselected state (reverse bias state) and expressed by the symbol in the figure. A voltage is applied to the memory cells MC in the unselected state (reverse bias state) from the unselected word lines WL (voltage V_reset) to the unselected bit lines BL (voltage 0 V) in a reverse bias direction of the diode Di. As a result, there is likewise no flow of current in the memory cells MC in the unselected state (reverse bias state).

Such a voltage-application method enables a desired voltage to be applied only to the selected memory cell MC_11 in the selected state. In the setting operation and the read operation, similar operations to that during the above-mentioned resetting operation are executed with changes to values of voltages applied to the bit lines and word lines. To execute the above-described operations reliably, it is necessary to transfer a voltage from the control circuit to the memory cell MC reliably.

Here, when performing an operation on the memory cell MC located at a position distant from the control circuit applying the voltage to the bit line BL and the word line WL, a voltage drop due to parasitic resistance in the entire path of current flow must be taken into consideration. That is, the memory cell MC disposed distant from the control circuit in the memory cell array 100 is affected by the parasitic resistance of the word line WL disposed in the memory cell array 100 and a line for connecting the word line WL to the control circuit. In contrast, the memory cell MC disposed at a position adjacent to the control circuit in the memory cell array 100 is almost unaffected by the parasitic resistance of these lines.

For example, when a voltage applied to the selected word line is set to 0 V, an end on the word line side of the memory cell MC disposed at the position adjacent to the control circuit in the memory cell array 100 is applied with a voltage extremely close to the 0 V set by the control circuit. However, when a memory cell MC disposed distant from the control circuit in the memory cell array 100 is selected, a potential of the end on the word line side of the memory cell MC rises on account of the voltage drop due to the parasitic resistance of the lines from the memory cell MC to the control circuit. As a result, even if the same voltage is applied to the bit line BL, a potential difference between an end on the bit line side and the end on the word line side of the memory cell MC may differ, due to difference in position of the memory cell MC.

In addition, the voltage drop due to the parasitic resistance of the lines is affected also by a number of memory cells MC on which an operation is simultaneously executed. When differing numbers of memory cells are simultaneously operated on, a current flowing in the parasitic resistance of the lines differs, and a value of the voltage drop changes. The potential difference between the end on the bit line side and the end on the word line side of the memory cell MC is likewise changed when the number of memory cells simultaneously operated on differs.

As described above, substantive operational conditions in the resistive memory device differ according to the position of the selected memory cell MC on which the operation is executed and the number of memory cells MC simultaneously operated on. There is concern not only that, as a result, variations in operational characteristics arise but also that an incorrect operation occurs due to an excessive applied voltage. For example, there is a risk that a voltage applied during the resetting operation exceeds the voltage for causing the setting operation in the memory cell MC, whereby the memory cell is incorrectly set subsequent to completion of the resetting operation. As described hereafter, various kinds of measures are applied to the voltage control circuit in the present embodiment to perform operations on the memory cell MC reliably.

Figure 2:
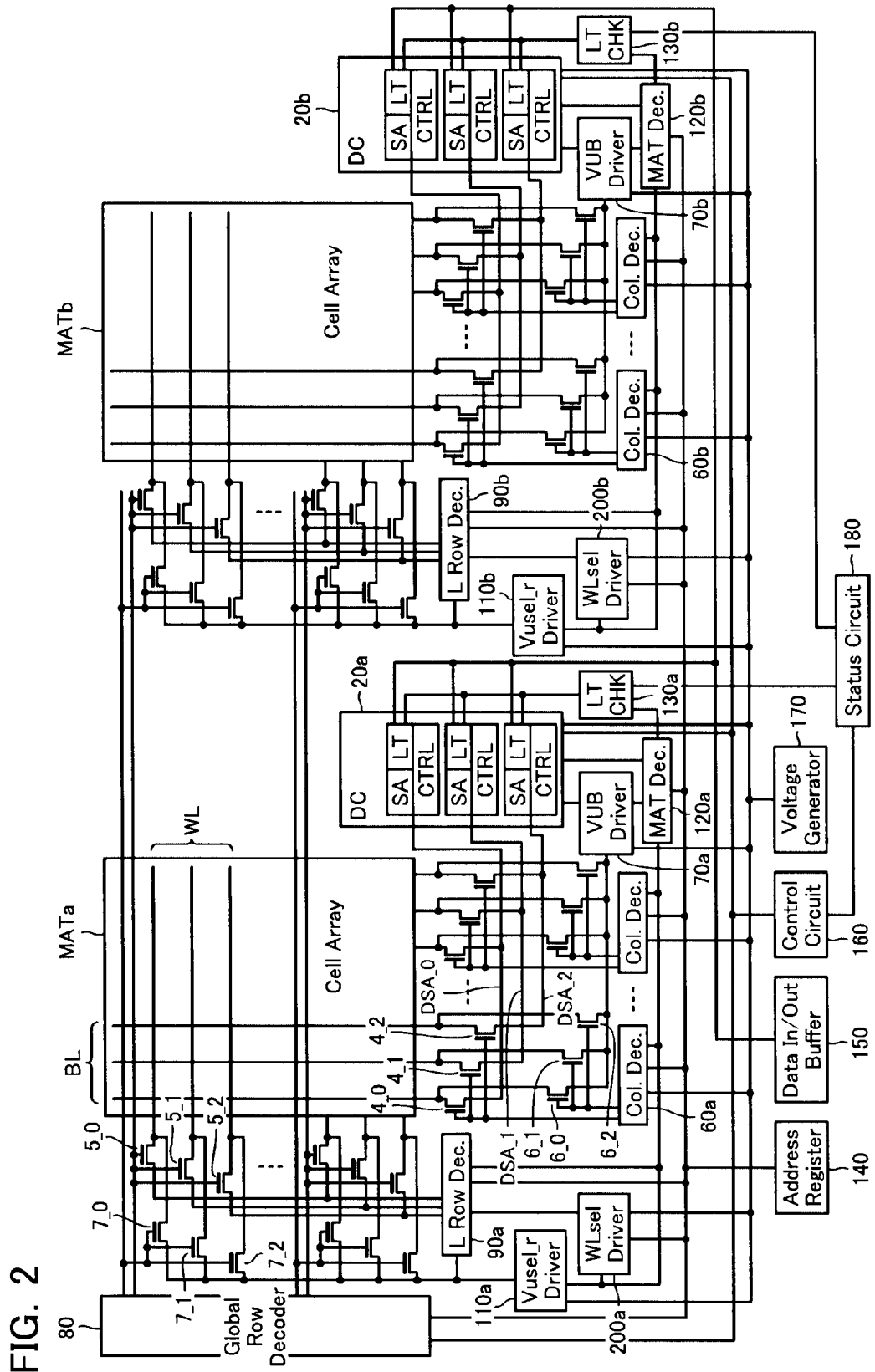
FIG. 2 is a block diagram showing a configuration of peripheral circuits of the resistive memory device in the embodiment of the present invention.

FIG. 2 is a block diagram showing a configuration of peripheral circuits for applying a voltage required in operation of the bit lines and word lines. Shown representatively here are two memory mats MAT (MATa and MATb), each having the above-described memory cell array 100 arranged thereon. In the present embodiment, an operation may be executed on one memory mat MATa only, or on a plurality of memory mats MATa and MATb simultaneously. Alternatively, a set of operations comprising a single address specification and operation run may be performed in turn for one of the plurality of memory mats MATa and MATb in a certain order.

Included in the peripheral circuits are data control circuits 20, column decoders 60, unselected bit line drive circuits 70, a global row decoder 80, local row decoders 90, unselected word line drive circuits 110, mat decoders 120, latch data check circuits 130, an address register 140, a data input/output buffer 150, a control circuit 160, a voltage generating circuit 170, a status circuit 180, and selected word line voltage control circuits 200. Note that configurations required separately for each memory mat MAT such as the column decoders 60 and the row decoders 90 are distinguished in FIG. 2 by the addition of characters a and b.

The bit lines BL are connected to the data control circuit 20 via the bit line select transistors 4_0-4_2. The data control circuit 20 comprises a sense amplifier circuit SA for detecting read data, a latch circuit LT for temporarily storing the read data and write data, and a voltage control circuit CTRL, and so on, as described hereafter. The bit lines BL are in addition connected also to the bit line select transistors 6_0-6_2. When the bit line BL is unselected, it is connected to the unselected bit line drive circuit 70 via the bit line select transistors 6_0-6_2 to be supplied with a certain unselected bit line voltage in accordance with an operation.

Furthermore, the word lines WL are connected to the local row decoder 90 via the word line select transistors 5_0-5_2. The word lines WL are in addition connected also to the word line select transistors 7_0-7_2. When the word line WL is unselected, it is connected to the unselected word line drive circuit 110 via the word line select transistors 7_0-7_2 to be supplied with a certain unselected word line voltage in accordance with an operation. On the other hand, when the word line WL is selected, it is connected to the selected word line voltage control circuit 200 via the word line select transistors 5_0-5_2 and the local row decoder 90 to be supplied with a certain selected word line voltage in accordance with an operation. This voltage applied to the selected word line WL is described in detail hereafter.

In this FIG. 2, the row decoder is assumed to have a hierarchical structure of the global row decoder 80, and the local row decoder 90 attached to each of the memory mats MATa and MATb, such that word line selection is performed by the hierarchical structure of row decoders. Note that, in the row decoder of FIG. 2, both the word line select transistors 5_0-5_2 and the word line select transistors 7_0-7_2 are configured by NMOS transistors. In this case, an output signal of the global row decoder 80 is set as a complementary signal for gate drive of the respective transistors (not shown). Similarly, both the bit line select transistors 4_0-4_2 and the bit line select transistors 6_0-6_2 are also NMOS transistors, respective gates of the transistors being controlled by two complementary signals outputted from the column decoder 60.

Note that PMOS transistors can be used for the bit line select transistors 4_0-4_2 and the word line select transistors 7_0-7_2. In such a case, a decode signal outputted from the column decoder 60 and the global decoder 80 need not be a complementary signal but may also be a single signal. Whether or not a PMOS transistor can be used in a bit line select unit and word line select unit is determined by whether or not a voltage required to be transferred is sufficiently higher than a threshold voltage of the PMOS transistor.

When PMOS transistors are used for the bit line select transistors 4_0-4_2 in a bit line select unit, a voltage outputted to the bit line must be at least a value of the threshold voltage Vt of the PMOS transistors with an added margin. The lowest Vt that the selected bit line voltage becomes during read is V_read during the read operation. For example, if a margin of, say, 0.4 V is added to the threshold voltage Vt (about −0.7 to −1 V) of the PMOS transistor, this gives at least 1.4 V; if no problems result from this in operational setting during read, then PMOS transistors may successfully be used.

Moreover, PMOS transistors can be used for the word line select transistors 7_0-7_2 in the word line select unit. A minimum value of a voltage outputted to the unselected word line WL is V_read during the read operation. Since the voltage applied to the unselected word line WL can be made higher to some degree than the read voltage V_read applied to the selected bit line BL, it is easier to use PMOS transistors for the word line select transistors 7_0-7_2 than in the bit-line select unit.

The mat decoder 120 is a decoder for selecting the memory mat MAT. If the bit lines BL and word lines WL are not shared with an adjacent memory mat MAT, the bit lines BL and word lines WL can both be set to 0 V in an unselected memory mat MAT. When the memory mat MATa is selected and the memory mat MATb is unselected, the mat decoder 120a outputs a selected state decode signal MATSEL="H", and the mat decoder 120b outputs an unselected state decode signal MATSEL="L". As a result, the above-mentioned voltage control required in read and data write due to the setting and resetting operations is performed on the bit lines BL and word lines WL on the selected memory mat MATa side.

On the other hand, on the unselected memory mat MATb side, if the bit lines BL and word lines WL are not shared with an adjacent memory mat MAT, an output signal received from the mat decoder 120b causes all outputs of the local row decoder 90b to become 0 V, and all outputs of the unselected word line drive circuit 110b also to become 0 V. Moreover, both output signals of the data control circuit 20b (potential of signal line DSA) and all outputs of the unselected bit line drive circuit 70b are controlled to be 0 V. It is of course also possible to set the memory mats MATa and MATb to the selected state simultaneously.

The column decoder 60, the global row decoder 80, the local row decoder 90, and the mat decoder 120 operate on the basis of address data supplied from the address register 140. Details are not shown here, but circuits suitable to the embodiment, such as a predecode circuit and a buffer for temporarily latching an address, can be appropriately installed between the address register 140 and the various kinds of decoders, similarly to other common memory devices.

The data input/output buffer 150 relays data exchanges between the chip exterior and circuits in the chip that leads data to the latch circuit LT in the data control circuit 20, and stores data temporarily as required. Circuits may be configured such that commands, addresses and so on are also downloaded to the chip interior via this data input/output buffer 150, as in NAND flash memory. Moreover, operations for write, read and so on of data are controlled by various control signals outputted from the control circuit 160 and by a voltage outputted from the voltage generating circuit 170. The latch data check circuit 130 and the status circuit 180 are provided as circuits to fulfill a supporting role in these operation controls. They detect whether or not data stored in a data latch within the data control circuit is in a certain state, and have functions of feeding back the detected result to the control circuit 160 and of enabling a Pass/Fail result in the data write operation to be output to the chip exterior.

Figure 3:
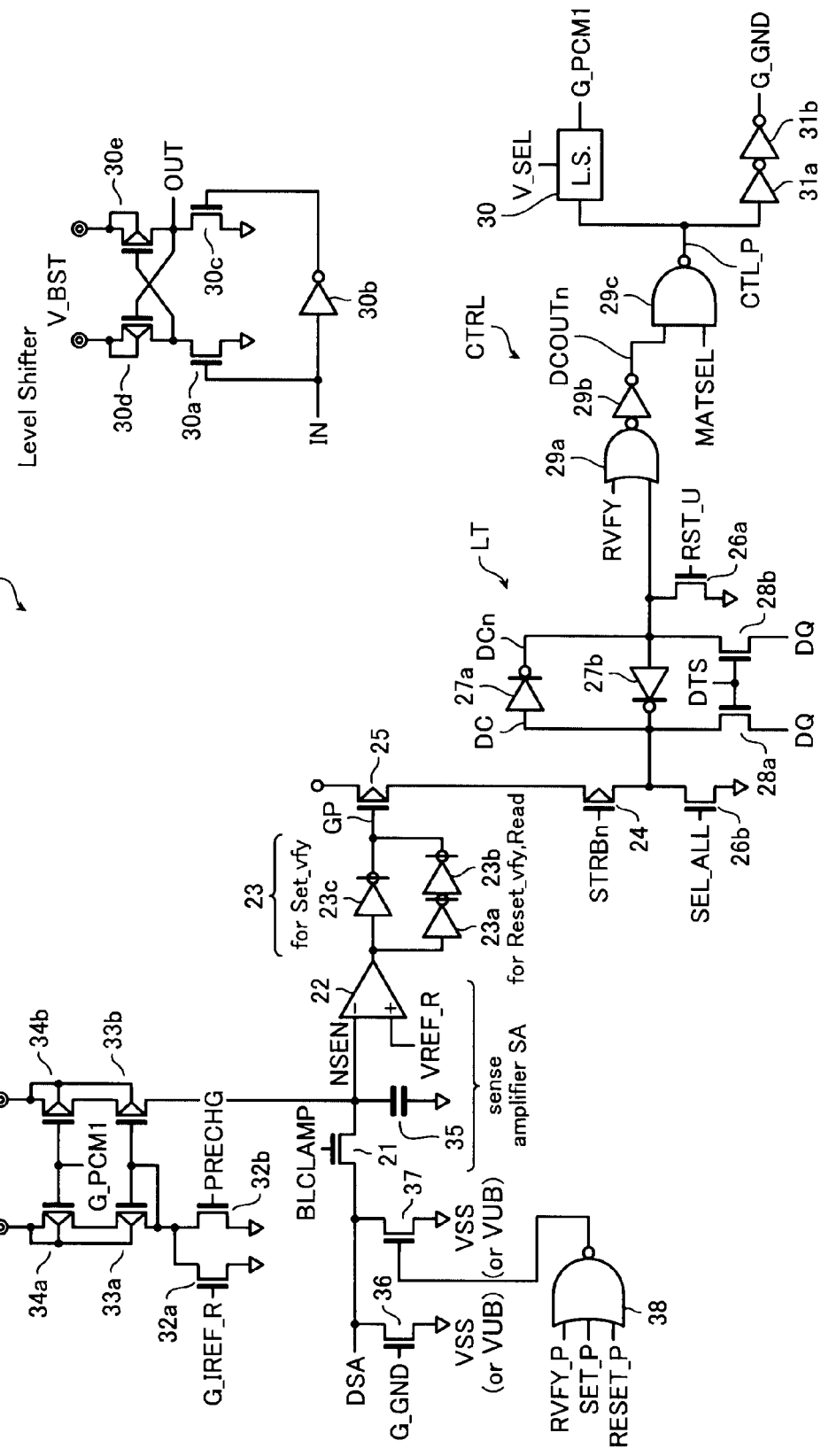
FIG. 3 is a circuit diagram describing details of a data control circuit in the embodiment of the present invention.

Next, details of the data control circuit 20 are described with reference to FIG. 3. As mentioned previously, the data control circuit 20 is broadly configured from the sense amplifier circuit SA, the latch circuit LT, and the voltage control circuit CTRL.

The sense amplifier circuit SA comprises a clamp transistor 21 and a differential amplifier 22. The clamp transistor 21 has one end connected to the signal line DSA, and the other end connected to an inverting input terminal (sense node NSEN) of the differential amplifier 22. Although not shown in FIG. 3, the signal line DSA is connected to the bit line BL via the aforementioned bit line select transistor 4. A non-inverting input terminal of the differential amplifier 22 is supplied with a reference potential VREF_R.

Note that connected between the signal line DSA and a ground terminal (or a VUB terminal (terminal applied with from between 0 V and a forward voltage Vf (up to about 0.6 V) of the diode)) are a capacitor 35 and NMOS transistors 36 and 37. The NMOS transistor 36, by having a short signal G_GND inputted to a gate thereof, functions to discharge the signal line DSA to a ground potential (or a potential of the VUB terminal). In addition, an output terminal of a NOR gate 38 is connected to a gate of the NMOS transistor 37. Inputted to input terminals of the NOR gate 38 are a signal RVFY_P which is "H" when a read voltage is applied to the bit line in the read operation and a verify operation, a signal SET_P which is "H" when a setting voltage is applied to the bit line in the setting operation, and a signal RESET_P which is "H" when a resetting voltage is applied to the bit line in the resetting operation.

In addition, connected to the sense node NSEN is a current mirror circuit CM comprising NMOS transistors 32a and 32b, and PMOS transistors 33a, 34a, 33b, and 34b. In addition to the PMOS transistors 33a, 34a, 33b, and 34b being used to configure a current mirror circuit having a switch control function, the NMOS transistors 32a and 32b are connected in parallel between the PMOS transistor 33a and the ground terminal, whereby a current is supplied to the current mirror circuit. When a reference current is inputted to the signal line DSA, the NMOS transistor 32a becomes conductive based on a signal G_IREF_R, and, when a precharge is performed on the selected bit line BL, the NMOS transistor 32b becomes conductive based on a signal PRECHG.

Basic operation of the sense amplifier circuit SA is as follows. That is, a cell current is passed to the selected memory cell MC, while a potential of the bit line BL is clamped with the clamp transistor 21. A reference current from the current mirror circuit CM is passed into the sense node NSEN. A change in potential of the sense node NSEN due to a difference between the cell current and the reference current is judged by the differential amplifier 22.

Output of the differential amplifier 22 is loaded into the latch circuit LT as output of the sense amplifier circuit SA. The latch circuit LT is configured by cross-coupled clocked inverters 27a and 27b. Note that an input terminal of the clocked inverter 27a is defined as node DC, and an output terminal of the clocked inverter 27a is defined as node DCn.

An NMOS transistor 26a sets the node DC to "H" by a gate signal RST_U. Conversely, a transistor 26b sets the node DC to "L" by a gate signal SEL_ALL. Two PMOS transistors 24 and 25 connected in series are further connected to the node DC to load the output of the differential amplifier 22 to the latch circuit LT. An output signal of the differential amplifier 22 is inputted to a gate GP of the PMOS transistor 25 via a data transfer circuit 23. The PMOS transistor 24 is connected between a drain of the PMOS transistor 25 and the node DC, and is configured to be capable of changing the node DC to "H" when a gate signal STRBn is "L". That is, if the node GP is "L", the node DC can be changed to "H", and if the node GP is "H", the node DC is held in a previous state.

Next, a configuration of the voltage control circuit CTRL for translating a state of the latch circuit LT into control of the bit line BL is described. The voltage control circuit CTRL comprises a NOR gate 29a, an inverter 29b, a NAND gate 29c, a level shifter 30, and inverters 31a and 31b.

The NOR gate 29a and the inverter 29b function as a logic gate unit to prevent the output of the latch circuit LT from affecting control of the bit line BL when a signal RVFY is "H" (that is, during execution of the read operation and during execution of the verify operation, hereafter referred to as "read-related operations"). That is, although the node DCn is connected to one of input terminals of the NOR gate 29a, a configuration is such that setting the signal RVFY to "H" causes a state of the node DCn to be ignored. That is, in the read-related operations, a read operation can be performed by a certain data control circuit 20 determined by the signal RVFY, independent of the data stored in the latch circuit LT. On the other hand, provided the signal RVFY is not set to "H", control by the signal RVFY allows operation based on data stored in the latch circuit LT.

An output signal DCOUTn of the inverter 29b is inputted to the NAND gate 29c along with a signal MATSEL. The signal MATSEL is a signal set to "L" during standby and when the memory mat MAT is unselected. When the signal MATSEL is "L", a signal G_PCM1 is set to "H" via the level shifter 30, whereby the PMOS transistors 33a and 33b are turned off, and operation of the current mirror circuit CM is suspended. Moreover, a signal G_GND is set to "H" via inverters 31a and 31b, whereby the NMOS transistor 36 is turned on, and the signal line DSA is caused to discharge to the ground potential or a potential of the VUB terminal.

In addition, an output signal CTL_P from the NAND gate 29c becomes an input signal to the inverter 31a. An output signal from the inverter 31a is further inputted to the inverter 31b, whereby the inverter 31b outputs the signal G_GND. Note that the level shifter 30 is for example a circuit configured by connecting NMOS transistors 30a and 30c, PMOS transistors 30d and 30e, and an inverter 30b, as shown in FIG. 3. The transistors 30a and 30d, and the transistors 30c and 30e are respectively connected between the power supply terminal and the ground terminal, and gates and drains of the transistors 30d and 30e have a cross-connected configuration. A gate of the transistor 30a is set as an input terminal of the level shifter 30. A gate of the transistor 30c is connected to the input terminal via the inverter 30b.

Moreover, the previously mentioned signal CTL_P is inputted to an input terminal IN of the level shifter 30, and the output signal G_PCM1 is outputted from an output terminal OUT.

Figure 4:
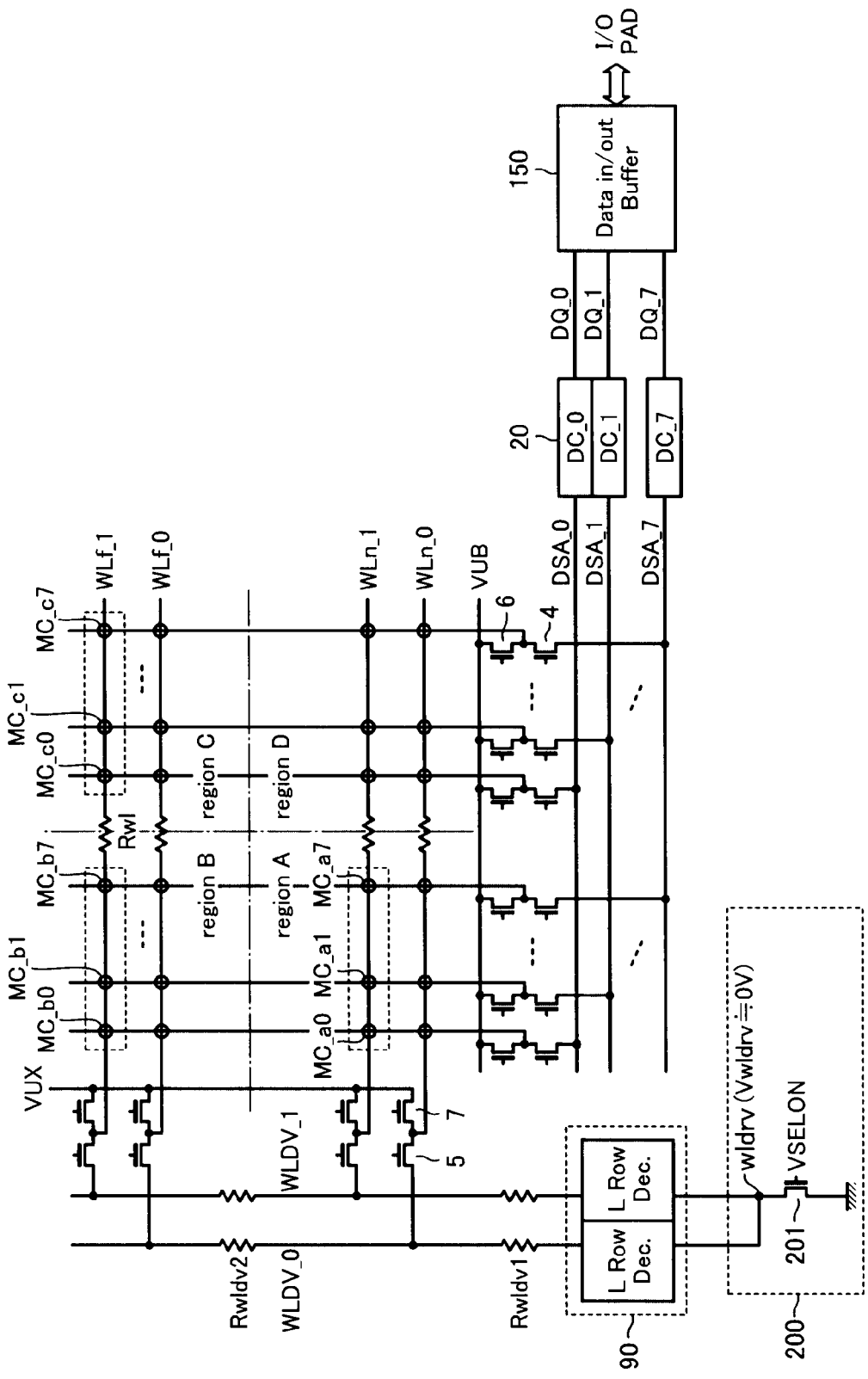
FIG. 4 is a circuit diagram describing details of a word line control circuit in a resistive memory device of a comparative example.

Next, the word line control circuit is described. For convenience of description, a word line control circuit and a resetting operation using the word line control circuit in a comparative example of the present embodiment are first described, after which the word line control circuit and the resetting operation using the word line control circuit in the resistive memory device in accordance with the present embodiment are described. FIG. 4 is a circuit diagram describing details of the word line control circuit in a resistive memory device of the comparative example.

(Configuration of the Word Line Control Circuit)

The word line control circuit in a resistive memory device of the comparative example is used to set a node wldrv connected to the selected word line to for example 0 V during execution of an operation on the memory cell MC. The selected word line voltage control circuit 200 is configured by a transistor 201 having a source grounded and a drain connected to the node wldrv. Operation of the selected word line voltage control circuit 200 is controlled by a signal VSELON inputted to a gate of the transistor 201. The signal VSELON, which is "H" during execution of the resetting operation, is a signal for setting a potential of the node wldrv to 0 V.

In addition, the node wldrv is connected to the local row decoder 90. The local row decoder 90 applies the potential 0 V of the node wldrv to a signal line WLDV during the resetting operation. As a result, in theory, a selected word line voltage 0 V is applied to the selected word line WL via the signal line WLDV and the word line select transistor 5. An unselected word line voltage V_reset for during the reset operation is applied to the unselected word line WL via the signal line VUX and the word line select transistor 7. However, as described hereafter, effects of parasitic resistance may cause the selected word line WL not to attain 0 V, resulting in an incorrect operation. Moreover, magnitude of the parasitic resistance differs according to a position of the memory cell MC in the memory cell array 100.

(Configuration of the Memory Cell Array)

Here, the memory cell array 100 shown in FIG. 4 is assumed to be divided into four regions, region A-region D. The memory cells MC disposed in region A are shown as MC_a0-MC_a7. Similarly, the memory cells MC disposed in regions B and C are shown as MC_b0-MC_b7 and MC_c0-MC_c7.

Region A is a region most adjacent to the word line control circuit including the selected word line voltage control circuit 200 in the memory cell array 100. The parasitic resistance of the signal line WLDV and the word line WL from the selected word line voltage control circuit 200 to region A may be expressed as a resistance Rwldv1 only, which is a resistance of the signal line WLDV between the voltage control circuit 200 and the word line WLn. Moreover, the parasitic resistance of the signal line WLDV and the word line WL from the selected word line voltage control circuit 200 to region B may be expressed as the resistance Rwldv1 and a resistance Rwldv2, which is a resistance of the signal line WLDV between the voltage control circuit 200 and the word line WLf. The parasitic resistance of the signal line WLDV and the word line WL from the selected word line voltage control circuit 200 to region D may be expressed as the resistance Rwldv1, which is a resistance of the signal line WLDV between the voltage control circuit 200 and the word line WLn, and a resistance Rwl of the word line WLn. Region C is a region most distant from the word line control circuit in the memory cell array 100. The parasitic resistance of the signal line WLDV and the word line WL from the selected word line voltage control circuit 200 to region C may be expressed as the resistance Rwldv1 and the resistance Rwldv2, which is a resistance of the signal line WLDV between the voltage control circuit 200 and the word line WLf, and a resistance Rwl of the word line WLf. As described above, the parasitic resistance of lines from the selected word line voltage control circuit 200 to the memory cell MC differs according to the position of the memory cell MC within the memory cell array 100.

(Configuration of the Bit Line Control Circuit)

Control of a voltage applied to the selected bit line in the resistive memory device of the comparative example is executed using the aforementioned data control circuit 20. Data inputted to the data input/output buffer 150 from an I/O pad is inputted to the latch circuit LT of the data control circuit 20 via a data line DQ. The node DSA is charged according to data set in the latch circuit LT, and a certain voltage (V_reset during the resetting operation) is applied to the selected bit line BL via the bit line select transistor 4. Moreover, a certain unselected bit line voltage (for example, 0 V) is applied to the unselected bit line BL via the signal line VUB and the bit line select transistor 6.

(Resetting Operation in the Semiconductor Memory Device of the Comparative Example)

Figure 5A:
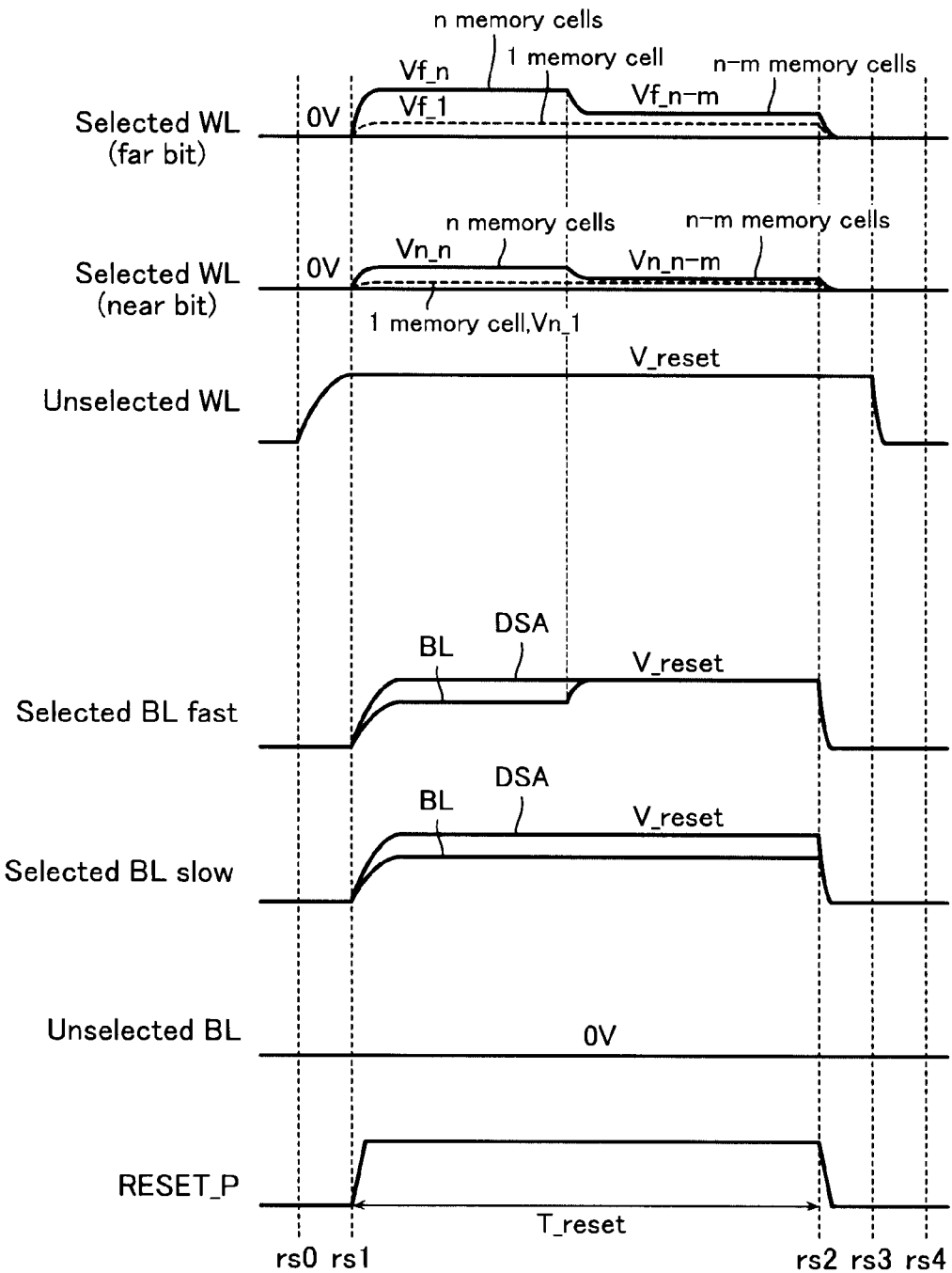
FIG. 5A is a timing chart describing operation in the resistive memory device of the comparative example.

FIG. 5A is a timing chart describing the resetting operation in the resistive memory device of the comparative example. Here, description proceeds on the assumption that the data control circuit 20 shown in FIG. 3 is used.

First, at time rs0, the unselected word line voltage V_reset is applied to the unselected word line WL. Moreover, a voltage 0 V is applied to the unselected bit line BL.

Next, at time rs1, the signal RESET_P inputted to the NOR gate 38 of the data control circuit 20 is pulled up to "H", and application of a resetting voltage to the bit line is commenced. Here, a period between times rs1 and rs2 in FIG. 5A is an effective resetting operation time T_reset. The signal RESET_P causes the data control circuit 20 to apply the resetting voltage V_reset to the signal line DSA, whereby the selected bit line BL is applied with a voltage lowered due to the parasitic resistance of the lines up to the memory cell MC. At this time, a potential of the selected word line WL is set to 0 V by the selected word line voltage control circuit 200. However, since a current flows in the memory cell MC in the low-resistance state on commencement of the resetting operation, then a voltage of an end of the memory cell MC connected to the word line WL rises to an extent that accords with a voltage drop in parasitic resistance of the lines from the selected word line voltage control circuit 200 to the memory cell MC.

FIG. 5A shows a potential of a selected word line WL (far bit) when the memory cell MC in region C distant from the selected word line voltage control circuit 200 is selected, and a potential of a selected word line WL (near bit) when the memory cell MC in region A adjacent to the selected word line voltage control circuit 200 is selected. The potential of the selected word line shown by a solid line illustrates the case where the resetting operation is executed simultaneously on n memory cells MC, and transition to the resetting state is completed for m (m<n) memory cells MC by a certain point of time during the resetting operation time T_reset. The potential of the selected word line shown by a broken line illustrates the case where the resetting operation is executed on one memory cell MC. The case where the resetting operation is executed on n memory cells MC is described below. At time rs1 when the resetting operation is commenced, the potential of the selected word line WL (far bit) rises to Vf_n due to the aforementioned effect of the voltage drop, and the potential of the selected word line WL(near bit) rises to Vn_n. Here, potential Vf_n>potential Vn_n.

Figure 5B:
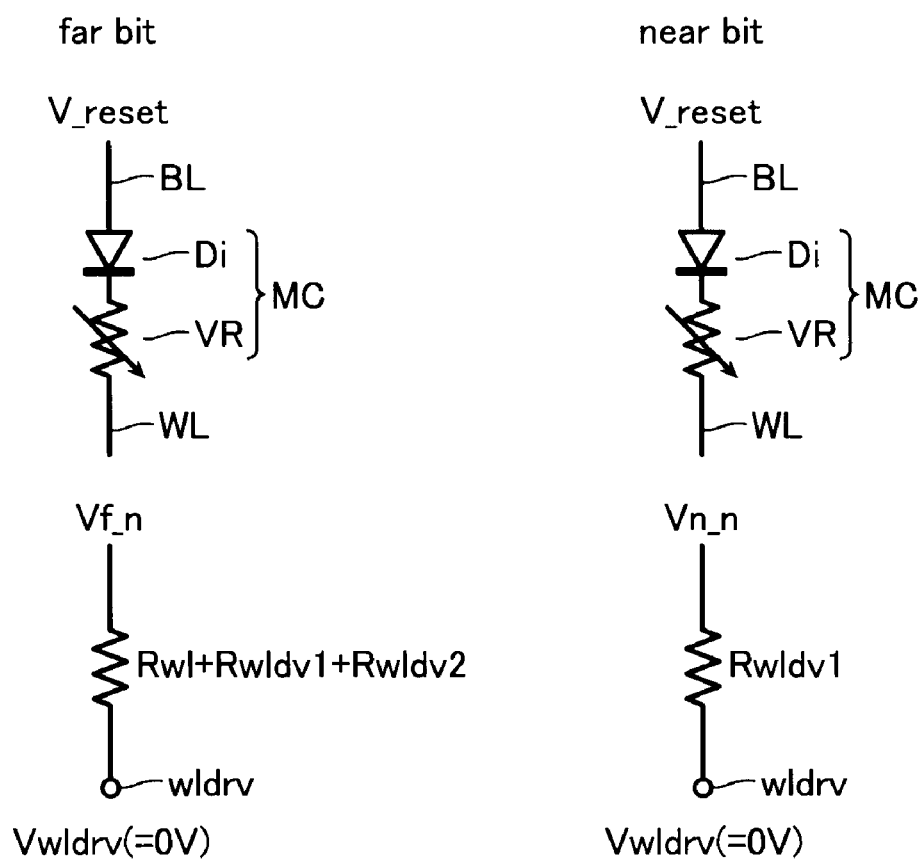
FIG. 5B is a view describing operation in the resistive memory device of the comparative example.

This rise in the selected word line potential is described using FIG. 5B. In FIG. 5B, "far bit" shows a state of the memory cell MC in region C distant from the selected word line voltage control circuit 200, and "near bit" shows a state of the memory cell MC in region A adjacent to the selected word line voltage control circuit 200. A voltage applied from the bit line side of the memory cell MC is V_reset for both "far bit" and "near bit". Moreover, a voltage applied to the node wldrv from the selected word line voltage control circuit 200 is 0 V. However, since the parasitic resistance from the word line connected to the memory cell to the node wldrv differs, the voltage (Vf_n and Vn_n) at a connection between the word line WL and the memory cell MC attains a different value for the "far bit" and the "near bit". A problem thus arises that a potential difference applied to the memory cell MC during the resetting operation differs according to the position of the memory cell MC.

When a state of the m memory cells MC changes from the low-resistance state to the high-resistance state prior to the remaining (n-m) memory cells MC before the end of the resetting operation time T_reset shown in FIG. 5A, a voltage of the selected bit line BL connected to the m memory cells MC changes as shown in [Selected BL fast] of FIG. 5A. When the memory cell MC changes from the low-resistance state to the high-resistance state, a current flowing in the memory cell MC is reduced and the effect of the parasitic resistance from the signal line DSA to the bit line BL is reduced, whereby a voltage applied to the memory cell MC increases.

Moreover, since a current flowing into the selected word line decreases, the voltage drop in the current path lessens, whereby a rise in the potential of the selected word line WL also lessens. Consequently, on completion of a change in the resistance state, the potential of the selected bit line BL and the selected word line WL change as shown in FIG. 5A. In contrast, for the remaining (n-m) memory cells MC, a potential of the selected bit line does not change during the time T_reset. The resetting operation on the (n-m) memory cells MC is thus continued until the certain resetting operation time T_reset elapses.

At time rs2, the signal RESET_P is set to "L", thereby completing resetting voltage application operations to the bit line. Subsequently, at time rs3, the unselected word line WL is discharged.

In this resetting operation, to reliably change the memory cell MC(far bit) in region C distant from the selected word line voltage control circuit 200 to the reset state, it is necessary to make the potential difference between the voltage V_reset and the voltage Vf_n greater than or equal to the voltage required in the resetting operation. However, if the voltage V_reset applied to the selected bit line BL is made large, a potential difference between the voltage V_reset and the voltage Vn_n applied across the memory cell MC (near bit) in region A near the selected word line voltage control circuit 200 increases, leading to a greater risk that a setting operation incorrectly occurs subsequent to completion of the resetting operation.

Moreover, even when the resetting operation is executed in the same region, if the number of memory cells MC on which the resetting operation is executed differs, the voltage at the end on the word line side of the memory cells differs as shown in FIG. 5A. Substantive operating conditions in the resistive memory device thus differ according to a position of the selected memory cell in the memory cell array on which the operation is executed and according to the number of memory cells simultaneously operated on.

As an example, when the resetting operation is executed on n memory cells in region C, the voltage drop due to the parasitic resistance of the lines can be expressed as n*I_reset* (Rwl+Rwldv1+Rwldv2), where I_reset is a current during the resetting operation.

In addition, when the resetting operation is executed on 1 memory cell in region A, the voltage drop due to the parasitic resistance of the lines can be expressed as 1*I_reset*Rwldv1, where I_reset is the current during the resetting operation.

Here, it is assumed that values of the various parasitic resistances are Rwl=6 kΩ, Rwldv1=0.4 kΩ, and Rwldv2=3.6 kΩ, and that n=4. In this case, the value of the voltage drop for the memory cells in region C is n*I_reset*(Rwl+Rwldv1+Rwldv2)=0.4 V, assuming I_reset=10 μA.

In addition, the value of the voltage drop for the memory cell in region A is 1*I_reset*Rwldv1=0.004 V, whereby a difference of approximately 0.4 V in conditions of the applied voltage occurs due to the position of the selected memory cell on which the operation is executed and due to the number of memory cells simultaneously operated on.

Figure 6:
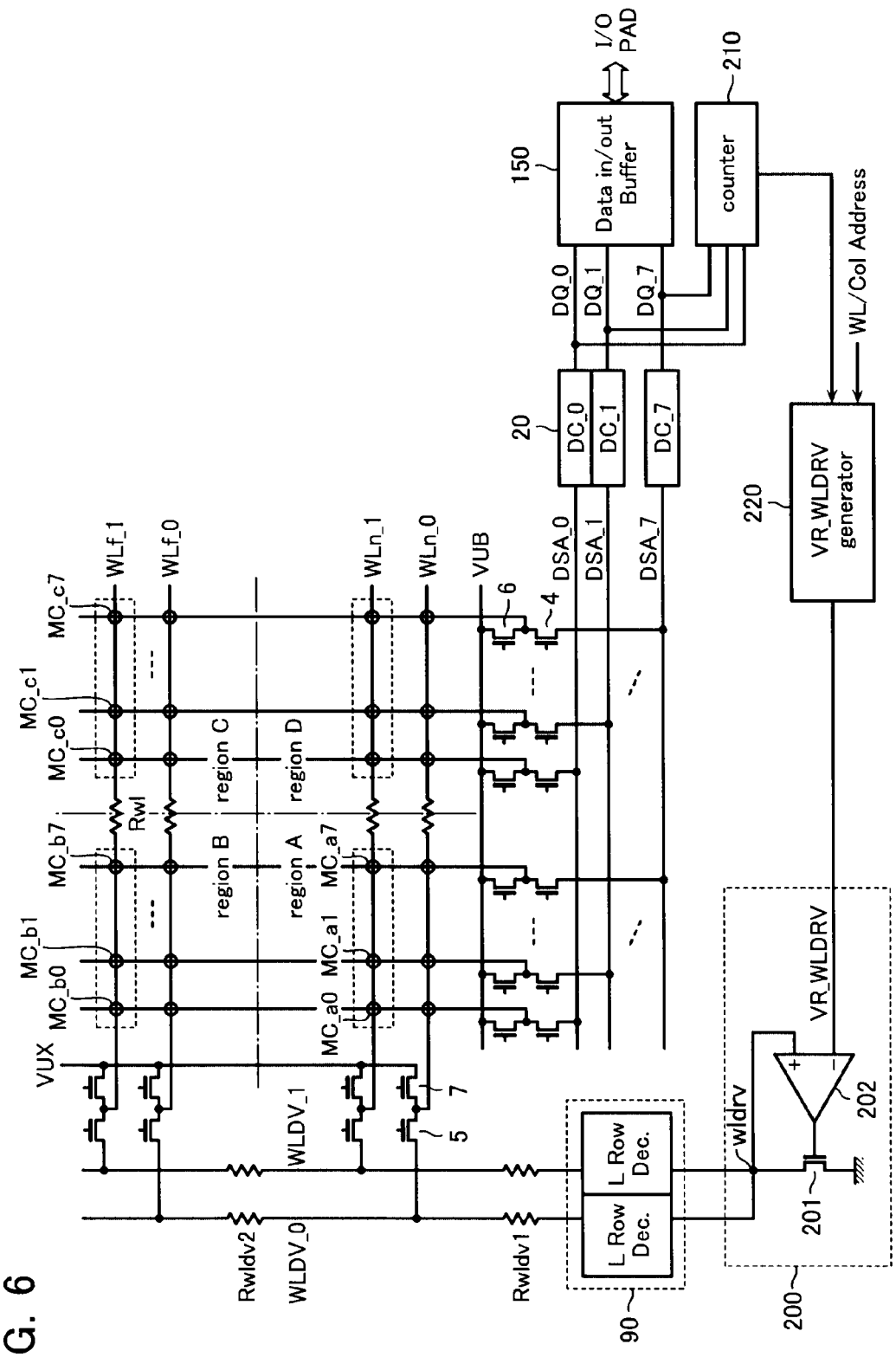
FIG. 6 is a circuit diagram describing details of a word line control circuit in the resistive memory device of a first embodiment.

Next, the word line control circuit and the resetting operation using the word line control circuit in the resistive memory device of the present embodiment are described. FIG. 6 is a circuit diagram describing details of the word line control circuit in the resistive memory device of the present embodiment.

(Configuration of the Word Line Control Circuit)

The word line control circuit in the resistive memory device of the present embodiment includes the selected word line voltage control circuit 200, a counter 210, and a reference voltage generating circuit 220. The selected word line voltage control circuit 200, the counter 210, and the reference voltage generating circuit 220 control a voltage applied to the selected word line WL based on the position of the selected memory cell on which the operation is executed and based on the number of memory cells simultaneously operated on.

The counter 210 is connected to the data line DQ of the data control circuit 20 and reads the resistance state of the memory cell MC via the data control circuit 20. This counter 210 reads the resistance state of the selected memory cell MC and counts the number of selected memory cells MC to which the resetting voltage needs to be applied during the resetting operation, prior to the resetting operation.

The reference voltage generating circuit 220 is inputted with the number of selected memory cells MC requiring application of the resetting voltage counted by the counter 210. The reference voltage generating circuit 220 is additionally inputted with a selected word line address signal and a selected column address signal as signals for expressing positional information of a selected cell. The reference voltage generating circuit 220 outputs a reference voltage VR_WLDRV of a certain value, based on the number of selected memory cells MC and the selected word line address signal and selected column address signal of the selected memory cells MC.

Figure 7:
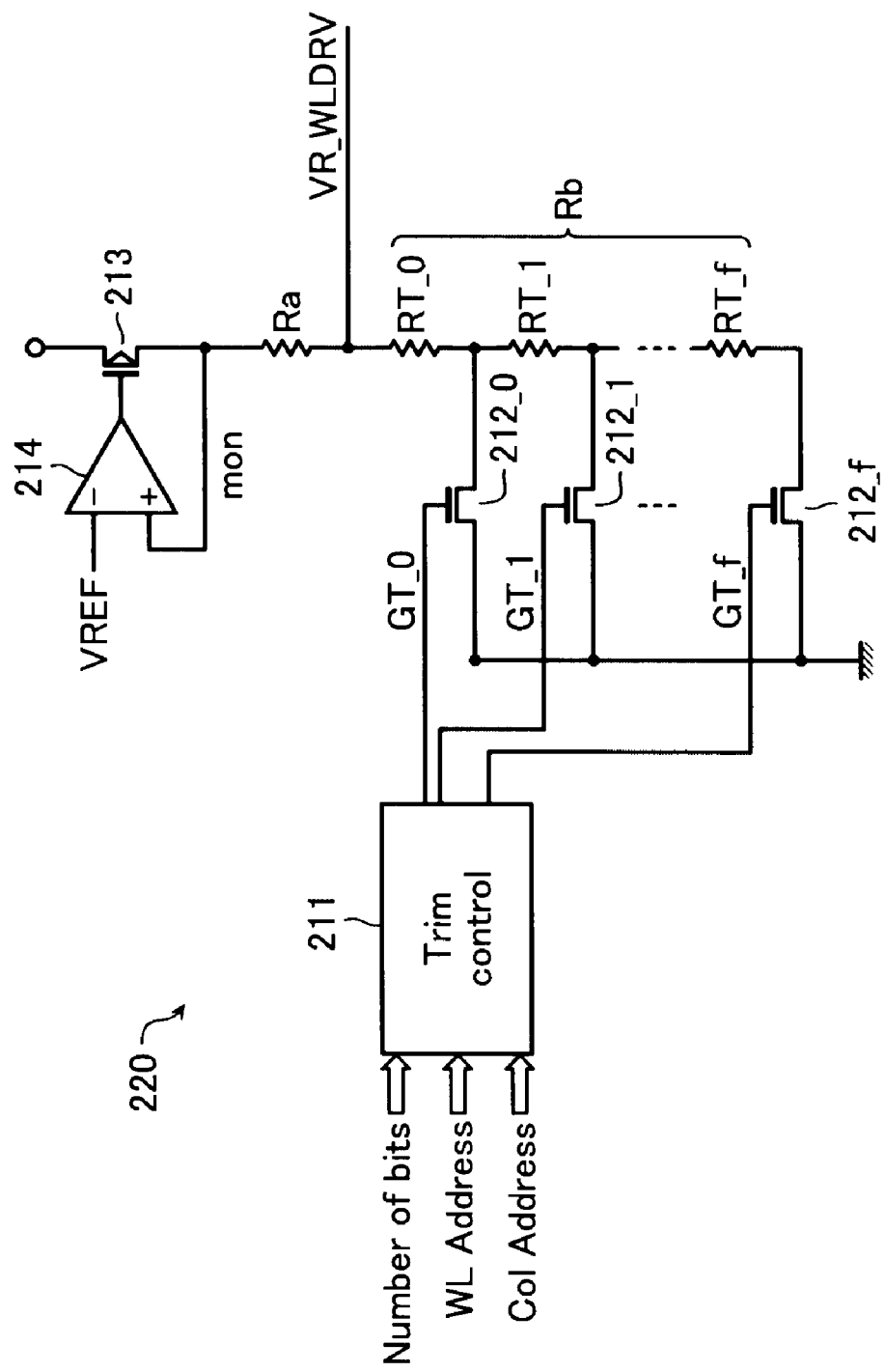
FIG. 7 is a circuit diagram describing details of the word line control circuit in the resistive memory device of the first embodiment.

A configuration example of the reference voltage generating circuit 220 is described with reference to FIG. 7. The reference voltage generating circuit 220 includes a trim control circuit 211 which functions to decode a signal showing the number of memory cells requiring application of the resetting voltage inputted from the counter 210, the word line address signal and the column address signal, and output signals GT_0-GT_f. Moreover, the reference voltage generating circuit 220 includes NMOS transistors 212_0-212_f having gates inputted with signals GT_0-GT_f, and a resistance Rb configured by resistors RT_0-RT_f connected in series. Drains of the transistors 212_0-212_f are respectively connected to each of connections between the resistors RT_0-RT_f connected in series. Sources of the transistors 212_0-212_f are commonly applied with the ground voltage.

In addition, the reference voltage generating circuit 220 includes a PMOS transistor 213, a differential amplifier 214, and a resistance Ra. A gate terminal of the transistor 213 has an output terminal of the differential amplifier 214 connected thereto, and a source of the transistor 213 is connected to a power supply terminal. Moreover, the transistor 213 is connected in series to the resistance Ra. A reference voltage VREF is inputted to an inverting input terminal of the differential amplifier 214, and a voltage of a connection node mon connecting between the transistor 213 and the resistance Ra is inputted to a non-inverting input terminal of the differential amplifier 214. In addition, the resistance Ra and the resistance Rb are connected at a connection node from which the reference voltage VR_WLDRV is outputted.

The reference voltage generating circuit 220 renders any one of the transistors 212 conductive using the signals GT_0-GT_f outputted from the trim control circuit 211, thereby determining a certain resistance value for the resistance Rb. In addition, the differential amplifier 214 compares the potential of the connection node mon connecting between the transistor 213 and the resistance Ra with the reference voltage VREF to control a voltage outputted to the gate terminal of the transistor 213. As a result, a value of the reference voltage VR_WLDRV outputted from the connection node connecting between the resistance Ra and the resistance Rb is controlled to a certain voltage based on the number of selected memory cells MC and the selected word line address signal and selected column address signal of the selected memory cells MC.

As shown in FIG. 6, the selected word line voltage control circuit 200 includes an NMOS transistor 201 having a source grounded and a drain connected to the node wldrv, and a differential amplifier 202. An output terminal of the differential amplifier 202 is connected to a gate terminal of the transistor 201. In addition, a voltage of the node wldrv is inputted to a non-inverting input terminal of the differential amplifier 202, and the reference voltage VR_WLDRV outputted from the reference voltage generating circuit 220 is inputted to an inverting input terminal of the differential amplifier 202. The differential amplifier 202 compares a voltage of the node wldrv and a voltage of the reference voltage VR_WLDRV, and controls a voltage inputted to the gate terminal of the transistor 201 such that the voltage of the node wldrv is equal to the voltage of the reference voltage VR_WLDRV. This selected word line voltage control circuit 200 sets the potential of the node wldrv to the same value as the reference voltage VR_WLDRV during execution of the resetting operation.

The node wldrv is connected to the local row decoder 90. The local row decoder 90 applies the potential of the node wldrv which is set to the same value as the reference voltage VR_WLDRV during the resetting operation to the signal line WLDV. The selected word line WL is applied with the voltage of the node wldrv based on the number of selected memory cells MC and the selected word line address signal and selected column address signal of the selected memory cells MC, via the signal line WLDV and the word line select transistor 5. The unselected word line WL is applied with the unselected word line voltage V_reset during the resetting operation, via the signal line VUX and the word line select transistor 7.

(Configuration of the Memory Cell Array)

A configuration of divided regions and parasitic resistance of lines of the memory cell array 100 in the resistive memory device of the present embodiment is similar to those in the resistive memory device of the comparative example shown in FIG. 4. That is, the memory cell array 100 shown in FIG. 6 is assumed to be divided into four regions, region A-region D. The memory cells MC disposed in region A are shown as MC_a0-MC_a7. Similarly, the memory cells MC disposed in regions B and C are shown as MC_b0-MC_b7 and MC_c0-MC_c7.

Region A is a region most adjacent to the word line control circuit including the selected word line voltage control circuit 200 in the memory cell array 100. The parasitic resistance of the signal line WLDV and the word line WL from the selected word line voltage control circuit 200 to region A may be expressed as a resistance Rwldv1 only, which is a resistance of the signal line WLDV between the voltage control circuit 200 and the word line WLn. Moreover, the parasitic resistance of the signal line WLDV and the word line WL from the selected word line voltage control circuit 200 to region B may be expressed as the resistance Rwldv1 and a resistance Rwldv2, which is a resistance of the signal line WLDV between the voltage control circuit 200 and the word line WLf. The parasitic resistance of the signal line WLDV and the word line WL from the selected word line voltage control circuit 200 to region D may be expressed as the resistance Rwldv1, which is a resistance of the signal line WLDV between the voltage control circuit 200 and the word line WLn, and a resistance Rwl of the word line WLn. Region C is a region most distant from the word line control circuit in the memory cell array 100. The parasitic resistance of the signal line WLDV and the word line WL from the selected word line voltage control circuit 200 to region C may be expressed as the resistance Rwldv1 and the resistance Rwldv2, which is a resistance of the signal line WLDV between the voltage control circuit 200 and the word line WLf, and a resistance Rwl of the word line WLf. As described above, the parasitic resistance of lines from the selected word line voltage control circuit 200 to the memory cell MC differs according to the position of the memory cell MC within the memory cell array 100.

(Configuration of the Bit Line Control Circuit)

A configuration of the bit line control circuit in the resistive memory device of the present embodiment is similar to that in the resistive memory device of the comparative example shown in FIG. 4. Therefore, identical symbols are assigned to corresponding parts and descriptions thereof omitted.

(Resetting Operation in the Semiconductor Memory Device in Accordance with the First Embodiment)

Figure 8A:
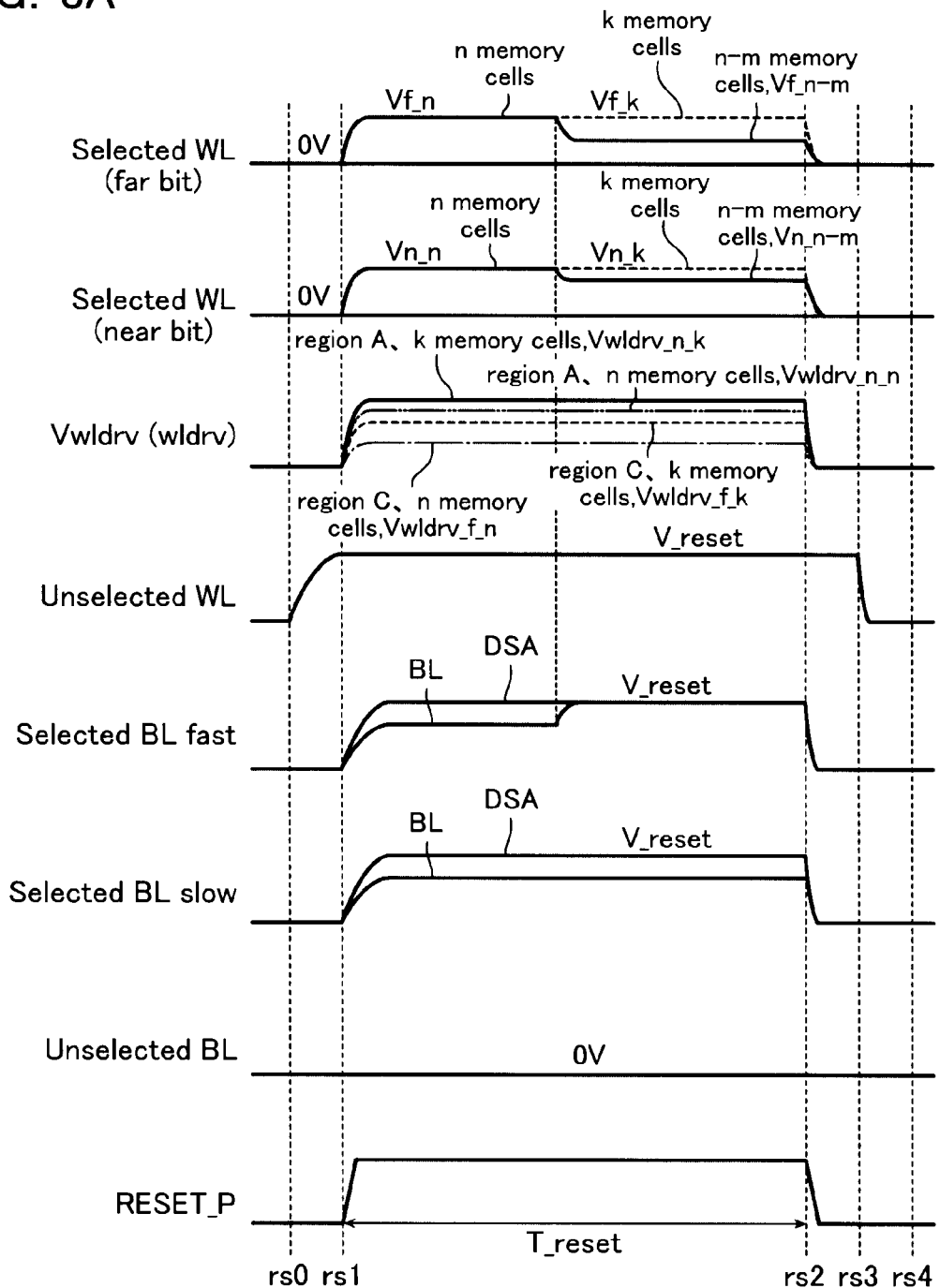
FIG. 8A is a timing chart describing operation in the resistive memory device of the first embodiment.

FIG. 8A is a timing chart describing the resetting operation in the resistive memory device of the first embodiment.

Prior to the resetting operation, the number of memory cells on which the operation is to be executed is counted by the counter 210. In addition, the reference voltage generating circuit 220 outputs the reference voltage VR_WLDRV based on the position of the selected memory cell on which the operation is to be executed and based on the number of memory cells simultaneously operated on.

At time rs0, the unselected word line voltage V_reset for during the resetting operation is applied to the unselected word line WL. Moreover, a voltage 0 V is applied to the unselected bit line BL.

Next, at time rs1, the signal RESET_P inputted to the NOR gate 38 of the data control circuit 20 is pulled up to "H", and application of a resetting voltage to the bit line is commenced. Here, a period between times rs1 and rs2 in FIG. 8A is an effective resetting operation time T_reset. The signal RESET_P causes the data control circuit 20 to apply the resetting voltage V_reset to the signal line DSA, whereby the selected bit line BL is applied with a voltage lowered due to the parasitic resistance of the lines up to the memory cell MC. At this time, the voltage Vwldrv outputted to the node wldrv from the selected word line voltage control circuit 200 is set to a value which differs according to the number of selected memory cells MC and the word line address signal and column address signal of the selected memory cells MC. That is, when n memory cells MC in region C undergo the resetting operation, the voltage Vwldrv is set to Vwldrv_f_n. When k (k<n) memory cells MC in region C undergo the resetting operation, the voltage Vwldrv is set to Vwldrv_f_k which is higher than Vwldrv_f_n. When n memory cells MC in region A undergo the resetting operation, the voltage Vwldrv is set to Vwldrv_n_n which is higher than Vwldrv_f_n. And when k (k<n) memory cells MC in region A undergo the resetting operation, the voltage Vwldrv is set to Vwldrv_n_k which is higher than Vwldrv_n_n.

Here, as previously mentioned, since a current flows in the memory cell MC in the low-resistance state on commencement of the resetting operation, then a voltage of an end of the memory cell MC connected to the word line WL rises to an extent that accords with a voltage drop due to parasitic resistance of the lines from the selected word line voltage control circuit 200 to the memory cell MC. FIG. 8A shows a potential of a selected word line WL (far bit) connected to the memory cell MC in region C distant from the selected word line voltage control circuit 200, and a potential of a selected word line WL(near bit) connected to the memory cell MC in region A adjacent to the selected word line voltage control circuit 200. The potential of the selected word line shown by a solid line illustrates the case where the resetting operation is executed simultaneously on n memory cells MC, and transition to the resetting state is completed for m (m<n) memory cells MC by a certain point of time during the resetting operation time T_reset. The potential of the selected word line shown by a broken line illustrates the case where the resetting operation is executed on k (k<n) memory cells MC.

The case where the resetting operation is executed on n memory cells MC in region C and the case where the resetting operation is executed on n memory cells MC in region A are described below. At time rs1 when the resetting operation is commenced, the potential of the selected word line WL (far bit) rises to Vf_n, and the potential of the selected word line WL(near bit) rises to Vn_n. Here, potential Vf_n≈potential Vn_n.

Figure 8B:
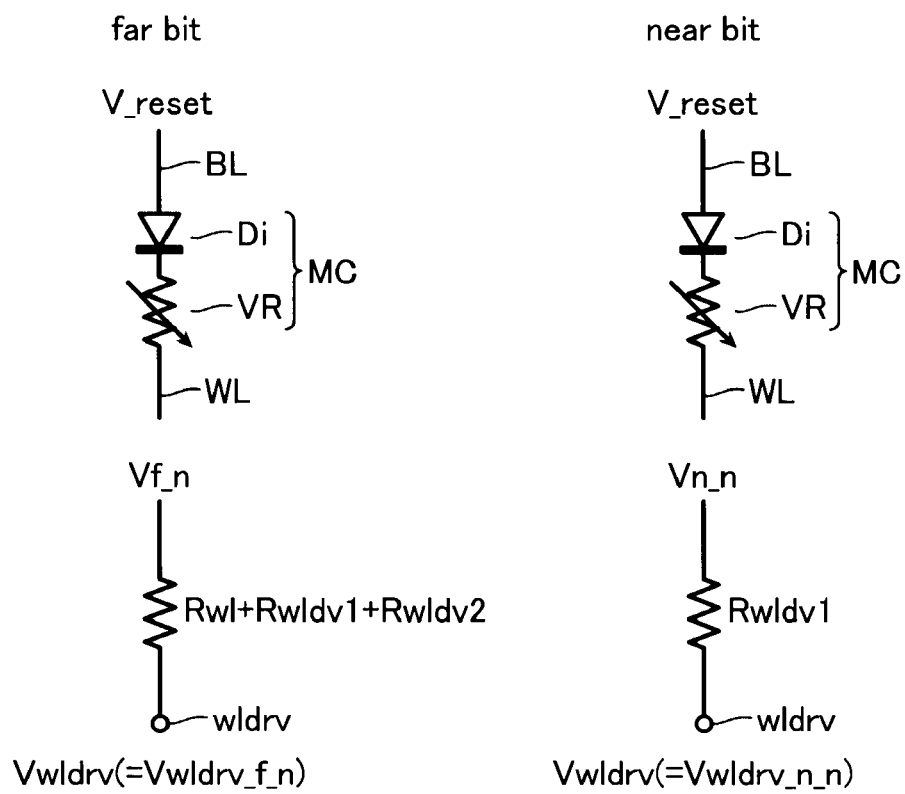
FIG. 8B is a view describing operation in the resistive memory device of the first embodiment.

This rise in the word line potential is described using FIG. 8B. In FIG. 8B, "far bit" shows a state of the memory cell MC in region C distant from the selected word line voltage control circuit 200, and "near bit" shows a state of the memory cell MC in region A adjacent to the selected word line voltage control circuit 200. Although both "far bit" and "near bit" are applied with a common voltage, namely V_reset, from the bit line side of the memory cell MC, voltages applied to the node wldrv differ for "far bit" and "near bit", being, respectively, the voltage Vwldrv_f_n and the voltage Vwldrv_n_n. These voltages Vwldrv_f_n and Vwldrv_n_n are set such that Vwldrv_f_n<Vwldrv_n_n.

The parasitic resistance from the word line WL connected to the memory cell to the node wldrv differs for "far bit" and "near bit". Thus, the voltage Vwldrv_f_n and the voltage Vwldrv_n_n are set to include an adjustment for this difference in the parasitic resistance based on the positional information of the selected memory cell expressed in the addresses. The voltage Vwldrv_f_n is set approximately equal to a voltage having a voltage drop portion due to the parasitic resistance (Rwl+Rwldv1+Rwldv2) of the lines subtracted from the voltage Vf_n. Moreover, the voltage Vwldrv_n_n is set approximately equal to a voltage having a voltage drop portion due to the parasitic resistance Rwldv1 of the lines subtracted from the voltage Vn_n. That is, by adjusting output voltages of the selected word line voltage control circuit 200, a word line potential of the selected memory cell portion is controlled to be substantially the same in the cases of both "far bit" and "near bit".

Next, the case where the resetting operation is executed on n memory cells MC in region C and the case where the resetting operation is executed on k memory cells MC in region C are described. At time rs1 when the resetting operation is commenced, the potential of the selected word line WL(far bit) when the resetting operation is executed on n memory cells MC rises to Vf_n, and the potential of the selected word line WL(far bit) when the resetting operation is executed on k memory cells MC rises to Vf_k. Here, potential Vf_n≈potential Vf_k.

Here, voltages applied to the node wldrv differ for the two cases, being, respectively, the voltage Vwldrv_f_n and the voltage Vwldrv_f_k. These voltages Vwldrv_f_n and Vwldrv_f_k are set such that Vwldrv_f_n<Vwldrv_f_k.

A value of the voltage drop also varies even in the same "far bit", since a current flowing in the parasitic resistance of the lines changes according to the number of memory cells MC simultaneously operated on. Thus, the voltage Vwldrv_f_n and the voltage Vwldrv_f_k are set to include an adjustment for such a difference in the voltage drop based on the respective numbers of simultaneously selected memory cells. The voltage Vwldrv_f_n is set approximately equal to a voltage having a voltage drop portion due to a sum of current flowing in n memory cells and due to the parasitic resistance (Rwl+Rwldv1+Rwldv2) of the lines subtracted from the voltage Vf_n. Moreover, the voltage Vwldrv_f_k is set approximately equal to a voltage having a voltage drop portion due to a sum of current flowing in k memory cells and due to the parasitic resistance (Rwl+Rwldv1+Rwldv2) of the lines subtracted from the voltage Vf_k. By changing output voltages of the selected word line voltage control circuit 200 in this way, a potential of the word line portion where the selected memory cell is positioned is controlled to be substantially the same.

As is clear from the above, the potential of the node wldrv is set to a lowest value where n memory cells MC in region C are selected, since the voltage drop due to the parasitic resistance of the lines is greatest in this case. Moreover, even for memory cells MC in region C, when k (n>k) bits are subject to resetting at commencement of the resetting, a level of the voltage Vwldrv is controlled to the voltage Vwldrv_f_k, since a reduced voltage drop due to the parasitic resistance is anticipated. And the potential of the node wldrv is set highest where k memory cells MC in region A are selected, since the voltage drop due to the parasitic resistance of the lines is least in this case.

When a state of the m memory cells MC in region C changes from the low-resistance state to the high-resistance state prior to the remaining (n-m) memory cells MC in region C before the end of the resetting operation time T_reset shown in FIG. 8A, a voltage of the selected bit line BL connected to the m memory cells MC changes as shown in [Selected BL fast] of FIG. 8A. When the memory cell MC change from the low-resistance state to the high-resistance state, a current flowing in the memory cell MC is reduced and the effect of the parasitic resistance from the signal line DSA to the bit line BL is reduced, whereby a voltage applied to the memory cell MC increases. Moreover, since a current flowing into the selected word line decreases, the voltage drop in the current path lessens, whereby a rise in the potential of the selected word line WL also lessens. Consequently, on completion of a change in the resistance state, the potential of the selected bit line BL and the selected word line WL change as shown in FIG. 8A. In contrast, for the remaining (n-m) memory cells MC, a potential of the selected bit line does not change during the time T_reset. The resetting operation on the (n-m) memory cells MC is thus continued until the certain resetting operation time T_reset elapses.

At time rs2, the signal RESET_P is set to "L", thereby completing resetting voltage application operations to the bit line. Subsequently, at time rs3, the unselected word line WL is discharged.

(Advantages of the Semiconductor Memory Device in Accordance with the First Embodiment)

In the resistive memory device in accordance with the present embodiment, since the voltage Vf_n and the voltage Vn_n of ends on the word line side of the n memory cells MC(far bit) in region C and the n memory cells MC(near bit) in region A are substantially the same, a difference in the applied voltage caused by the parasitic resistance of the lines can be reduced. It is thereby possible to match operational conditions for the selected memory cells on which the resetting operation is executed.

Moreover, even in the case where the resetting operation is executed in the same region C, the voltage Vwldrv applied to the node wldrv is adjusted according to the number of selected memory cells MC on which the resetting operation is executed. Even in the case where the number of selected memory cells in the resetting operation in the same region C differs, since the voltage Vf_n and the voltage Vf_k of ends on the word line side are substantially the same, a difference in the applied voltage caused by the number of cells in which the resetting current flows and by the parasitic resistance of the lines can be reduced.

The selected word line voltage control circuit 200 sets the potential of the node wldrv such that, whatever change occurs in the position of the selected memory cells MC within the memory cell array 100 and in the number of memory cells on which the operation is simultaneously executed, the voltage (Vf_n, Vf_k, Vn_n, Vn_k) at the connection between the word line WL and the memory cell MC is substantially the same. If the voltage (Vf_n, Vf_k, Vn_n, Vn_k) at the connection between the word line WL and the memory cell MC is substantially the same, the voltage applied to the selected memory cell MC during the resetting operation is constant whatever the selected memory cell MC. Since the resistive memory device in accordance with the present embodiment includes a function whereby differences in operational conditions arising from differences in the position of the selected memory cell and number of simultaneously selected memory cells during the resetting operation are controlled to be small, any memory cell can be operated on under appropriate conditions.

In the resistive memory device in accordance with the present embodiment, the positional information of the selected memory cell reflected in the reference voltage VR_WLDRV is, for example, the region A-region D shown in FIG. 6. Here, since the voltage drop due to the parasitic resistance per one memory cell MC on which the resetting operation is executed differs for each region, the method of adjusting the reference voltage VR_WLDRV may be changed according to the region. It is assumed, for example, that a level of the reference voltage VR_WLDRV in region C is adjusted taking cell numbers of 2, 4, 6, and 8 as boundaries. In this case, the level of the reference voltage VR_WLDRV in regions B and D where the voltage drop is smaller is adjusted taking a cell number of 4 as boundary, and an optimal level setting independent of cell numbers is adopted in region A. Such a level control is performed by the trim control circuit 211 in the reference voltage generating circuit 220.

Second Embodiment (Configuration of a Semiconductor Memory Device in Accordance with a Second Embodiment)

Figure 9:
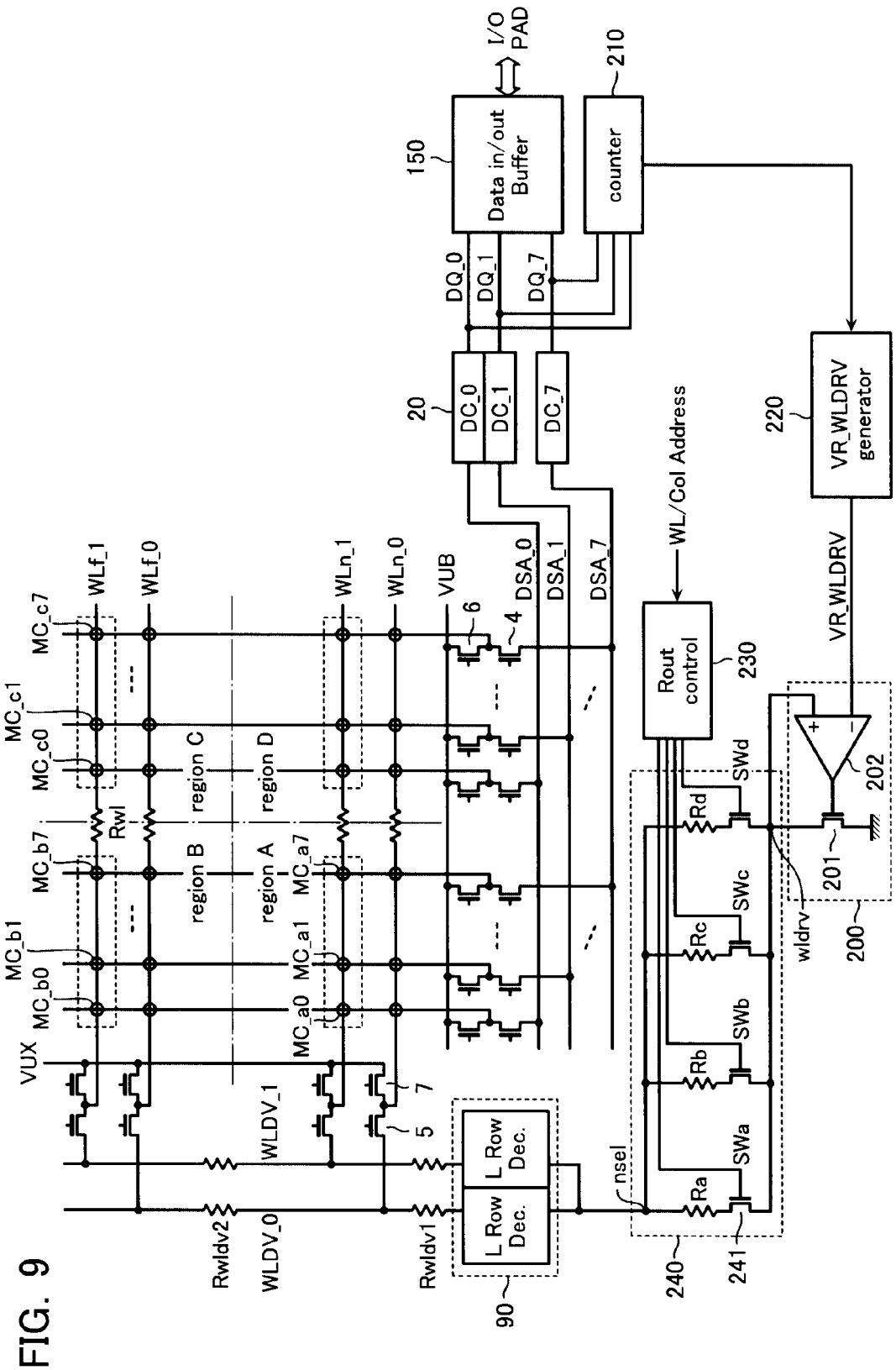
FIG. 9 is a circuit diagram describing details of a word line control circuit in a resistive memory device of a second embodiment.

Next, a word line control circuit and a resetting operation using the word line control circuit of a resistive memory device in a second embodiment of the present invention are described. FIG. 9 is a circuit diagram describing details of the word line control circuit in the resistive memory device of the present embodiment. A configuration of a memory cell array 100, a data control circuit 20, and so on, in the resistive memory device of the present embodiment is similar to those in the resistive memory device of the aforementioned first embodiment.

(Configuration of the Word Line Control Circuit)

The word line control circuit in the resistive memory device of the present embodiment includes a selected word line voltage control circuit 200, a counter 210, a reference voltage generating circuit 220, a resistance control circuit 230, and a resistance load circuit 240. The word line control circuit has a function of controlling a voltage applied to the selected word line WL based on the number of memory cells simultaneously operated on. Moreover, the word line control circuit has a function of inserting a resistor between the selected word line WL and the selected word line voltage control circuit 200 based on a position of the selected memory cell on which the operation is executed. Since configurations of the selected word line voltage control circuit 200 and the counter 210 are similar to those in the resistive memory device of the first embodiment, identical symbols are assigned to corresponding parts and descriptions thereof omitted.

The reference voltage generating circuit 220 in the present embodiment is inputted only with the number of selected memory cells MC requiring application of the resetting voltage counted by the counter 210. The reference voltage generating circuit 220 outputs a reference voltage VR_WLDRV of a certain value, based on the number of selected memory cells MC.

The selected word line voltage control circuit 200 sets a potential of the node wldrv to the same value as a reference voltage VR_WLDRV which is based on the number of selected memory cells MC, during execution of the resetting operation.

The resistance load circuit 240 is provided between the node wldrv and the local row decoder 90. The resistance load circuit 240 includes NMOS transistors SWa-SWd connected in parallel to the node wldrv, and resistances Ra-Rd connected in series to the respective transistors SWa-SWd and having resistance values that differ from one another. The resistances Ra-Rd are each connected to a node nsel, and the node nsel is connected to the local row decoder 90. Here, values of the resistances Ra-Rd are set such that, for example, Ra≈Rwldv2+Rwl, Rb≈Rwl, Rc≈0, and Rd≈Rwldv2.

The resistance control circuit 230 is inputted with the selected word line address signal and the selected column address signal as signals expressing positional information of the selected memory cell. The resistance control circuit 230 outputs a signal to gates of the transistors SWa-SWd based on the word line address signal and the column address signal, thereby rendering a certain resistance conductive. Here, when the selected memory cell MC is shown to lie in region A, the resistance control circuit 230 renders the transistor SWa conductive. Similarly, when the selected memory cell MC is shown to lie in regions B, C, and D, the transistors SWb, SWc, and SWd are respectively rendered conductive. A resistor based on the position of the selected memory cell MC is thereby inserted between the node wldrv and the node nsel.

As previously mentioned, the selected word line voltage control circuit 200 sets the potential of the node wldrv to a value which is based on the number of selected memory cells MC. When a voltage is applied from this node wldrv to the word line WL connected to the memory cell MC in region A, the voltage is applied via the resistance Ra (resistance value: Rwldv2+Rwl) of the resistance load circuit 240 and the parasitic resistance Rwldv1 of the signal line WLDV. Moreover, when a voltage is applied from the node wldrv to the word line WL connected to the memory cell MC in region B, the voltage is applied via the resistance Rb (resistance value: Rwl) of the resistance load circuit 240 and the parasitic resistances Rwldv1 and Rwldv2 of the signal line WLDV. When a voltage is applied from the node wldrv to the word line WL connected to the memory cell MC in region C, the voltage is applied via the resistance Rc (resistance value: none added) of the resistance load circuit 240, the parasitic resistances Rwldv1 and Rwldv2 of the signal line WLDV, and the parasitic resistance Rwl of the word line. As a result of using the resistance load circuit 240 to insert a resistance which is based on the position of the selected memory cell MC, the resistance from the node wldrv to each of the memory cells MC within the memory cell array 100 has a substantially identical value.

The node nsel on an output side of the resistance load circuit 240 is connected to the local row decoder 90. The local row decoder 90 applies the potential of the node nsel to the signal line WLDV during the resetting operation. A selected word line voltage is applied to the selected word line WL via the signal line WLDV and the word line select transistor 5. An unselected word line voltage V_reset for during the resetting operation is applied to the unselected word line WL via the signal line VUX and the word line select transistor 7.

(Resetting Operation in the Semiconductor Memory Device in Accordance with the Second Embodiment)

Figure 10A:
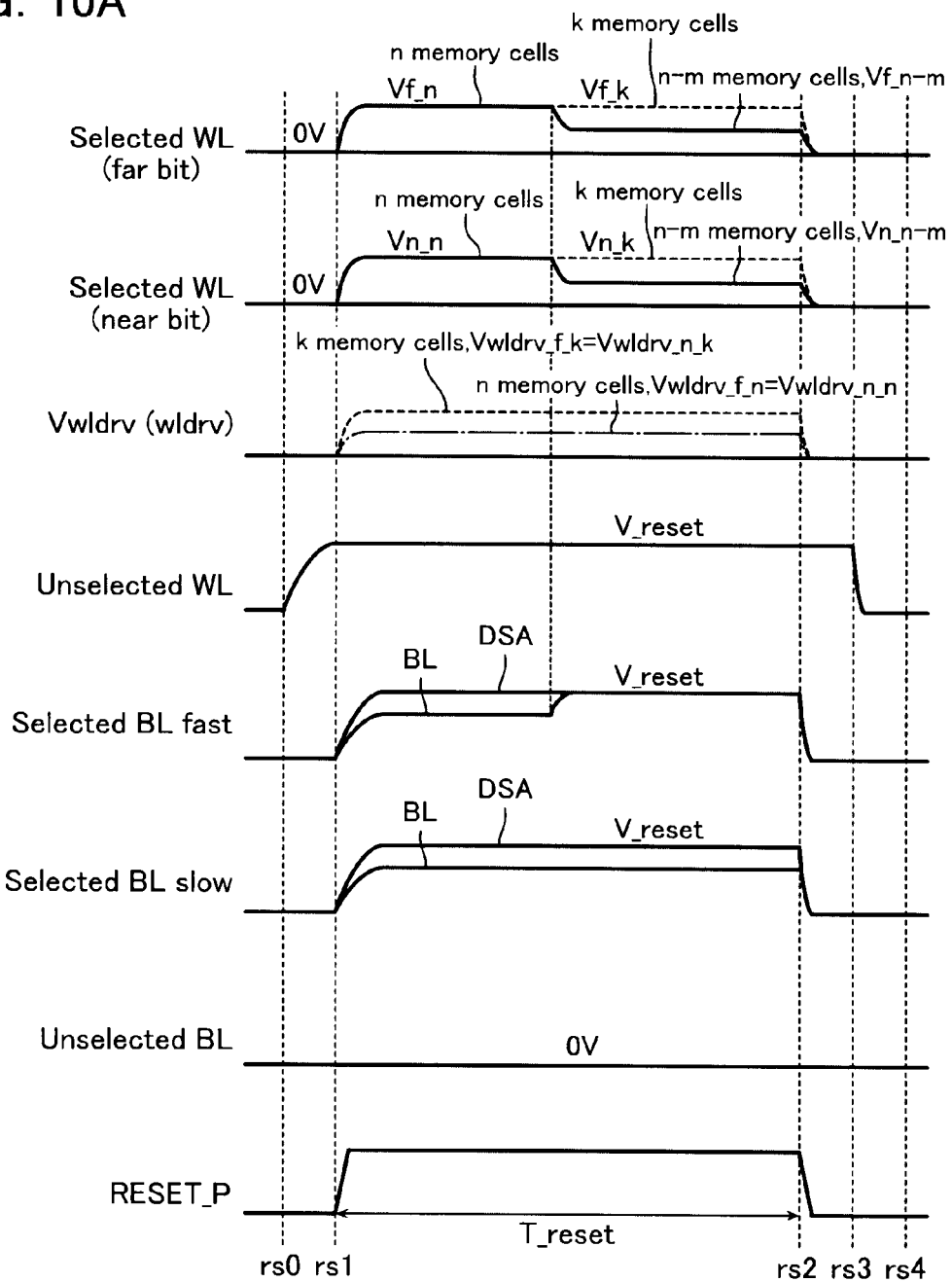
FIG. 10A is a timing chart describing operation in the resistive memory device of the second embodiment.

FIG. 10A is a timing chart describing the resetting operation in the resistive memory device in accordance with the second embodiment.

Prior to the resetting operation, the number of memory cells on which the operation is to be executed is counted by the counter 210. In addition, the reference voltage VR_WLDRV based on the number of memory cells to be simultaneously operated on is outputted by the reference voltage generating circuit 220, and the resistor based on the position of the selected memory cells on which the operation is to be executed is inserted by the resistance load circuit 240.

At time rs0, the unselected word line voltage V_reset for during the resetting operation is applied to the unselected word line WL. Moreover, a voltage 0 V is applied to the unselected bit line BL.

Next, at time rs1, the signal RESET_P inputted to the NOR gate 38 of the data control circuit 20 is pulled up to "H", and application of a resetting voltage to the bit line is commenced. Here, a period between times rs1 and rs2 in FIG. 10A is an effective resetting operation time T_reset. The signal RESET_P causes the data control circuit 20 to apply the resetting voltage V_reset to the signal line DSA, whereby the selected bit line BL is applied with a voltage lowered due to the parasitic resistance of the lines up to the memory cell MC. At this time, the voltage Vwldrv outputted to the node wldrv from the selected word line voltage control circuit 200 is set to a certain value based on the number of selected memory cells MC. That is, when n memory cells MC undergo the resetting operation, the voltage Vwldrv is set to an identical value (Vwldrv_f_n=Vwldrv_n_n) regardless of whether the memory cells are disposed in region A or region C. Similarly, when k (k<n) memory cells MC undergo the resetting operation, the voltage Vwldrv is set to an identical value (Vwldrv_f_k=Vwldrv_n_k) regardless of whether the memory cells are disposed in region A or region C. Here, the voltage is set to a higher value when k memory cells MC undergo the resetting operation than when n memory cells MC undergo the resetting operation.

As previously mentioned, since a current flows in the memory cell MC in the low-resistance state on commencement of the resetting operation, then a voltage of an end of the memory cell MC connected to the word line WL rises to an extent that accords with a voltage drop due to parasitic resistance of the lines from the selected word line voltage control circuit 200 to the memory cell MC. FIG. 10A shows a potential of a selected word line WL(far bit) connected to the memory cell MC in region C distant from the selected word line voltage control circuit 200, and a potential of a selected word line WL(near bit) connected to the memory cell MC in region A adjacent to the selected word line voltage control circuit 200. The potential of the selected word line shown by a solid line illustrates the case where the resetting operation is executed simultaneously on n memory cells MC, and transition to the resetting state is completed for m (m<n) memory cells MC by a certain point of time during the resetting operation time T_reset. The potential of the selected word line shown by a broken line illustrates the case where the resetting operation is executed on k (k<n) memory cells MC.

The cases where the resetting operation is executed on n memory cells MC in region C and on n memory cells MC in region A are described below. At time rs1 when the resetting operation is commenced, the potential of the selected word line WL(far bit) rises to Vf_n, and the potential of the selected word line WL(near bit) rises to Vn_n. Here, potential Vf_n≈potential Vn_n.

Figure 10B:
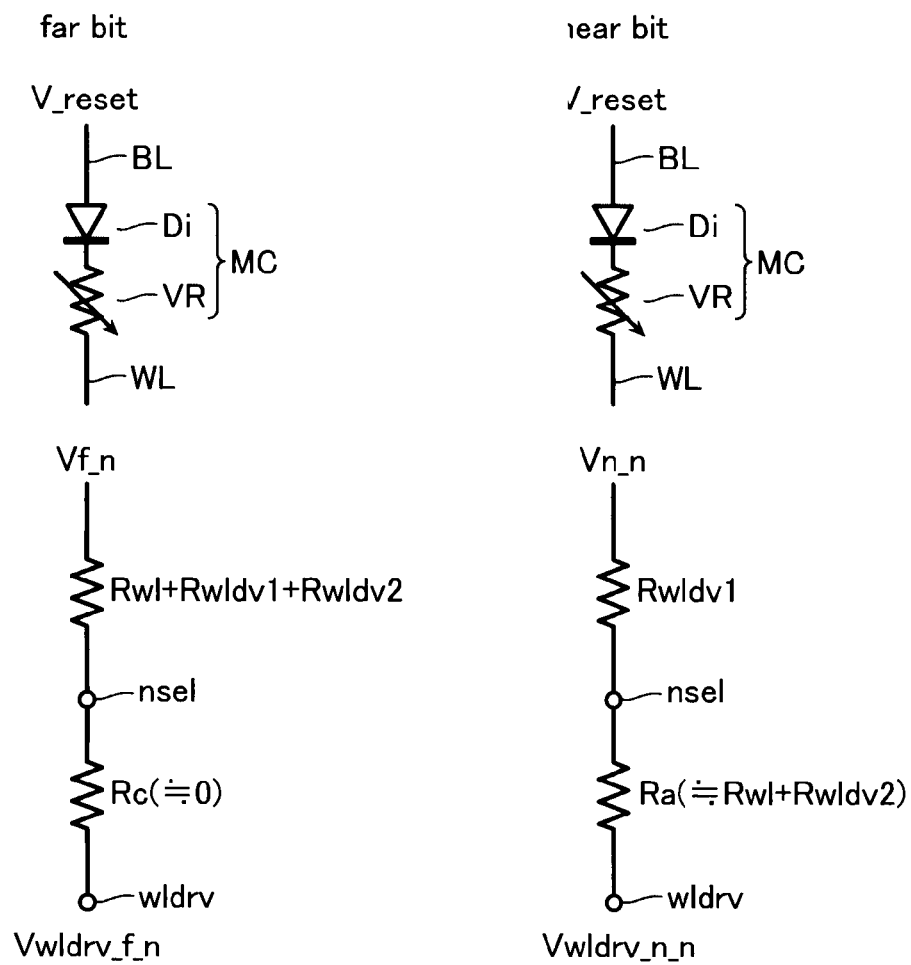
FIG. 10B is a view describing operation in the resistive memory device of the second embodiment.

This rise in the word line potential is described using FIG. 10B. In FIG. 10B, "far bit" shows a state of the memory cell MC in region C distant from the selected word line voltage control circuit 200, and "near bit" shows a state of the memory cell MC in region A adjacent to the selected word line voltage control circuit 200. The voltage applied from the bit line side of the memory cell MC is V_RESET for both "far bit" and "near bit". Here, the voltage Vwldrv_f_n and the voltage Vwldrv_n_n applied to the node wldrv are set to a common value since they are voltages at which the resetting operation is performed on identical numbers of memory cells.

Here, the resistance inserted between the node nsel and the node wldrv by the resistance load circuit 240 is set to a smallest value where the memory cell MC in region C is selected, since the voltage drop due to the parasitic resistance of the lines is greatest in this case. Conversely, the resistance inserted between the node nsel and the node wldrv by the resistance load circuit 240 is set to a largest value where the memory cell MC in region A is selected, since the voltage drop due to the parasitic resistance of the lines is least in this case.

The parasitic resistance from the word line WL connected to the memory cell to the node wldrv differs for "far bit" and "near bit". However, in the resistive memory device of the present embodiment, the resistance load circuit 240 connects a resistance on the basis of positional information of where the selected memory cell is disposed, such that the resistance between the selected memory cell and the node wldrv attains a substantially identical value.

Next, the case where the resetting operation is executed on n memory cells MC in region C and the case where the resetting operation is executed on k memory cells MC in region C are described. At time rs1 when the resetting operation is commenced, the potential of the selected word line WL(far bit) when the resetting operation is executed on n memory cells MC rises to Vf_n, and the potential of the selected word line WL(far bit) when the resetting operation is executed on k memory cells MC rises to Vf_k. Here, potential Vf_n≈potential Vf_k.

Here, voltages applied to the node wldrv differ for the two cases, being, respectively, the voltage Vwldrv_f_n and the voltage Vwldrv_f_k. These voltages Vwldrv_f_n and Vwldrv_f_k are set such that Vwldrv_f_n<Vwldrv_f_k.

The voltage drop varies even in the same "far bit", since a current flowing in the word lines changes when the number of memory cells MC simultaneously operated on changes. Thus, the voltage Vwldrv_f_n and the voltage Vwldrv_f_k are set to include an adjustment for such a difference in the voltage drop based on the number of selected memory cells on which the operation is simultaneously executed. The voltage Vwldrv_f_n is set approximately equal to a voltage having a voltage drop portion due to a current flowing in n memory cells and due to the parasitic resistance (Rwl+Rwldv1+Rwldv2) of the lines subtracted from the voltage Vf_n. Moreover, the voltage Vwldrv_f_k is set approximately equal to a voltage having a voltage drop portion due to a current flowing in k memory cells and due to the parasitic resistance (Rwl+Rwldv1+Rwldv2) of the lines subtracted from the voltage Vf_k.

As is clear from the above, the resistance value of the resistor inserted by the resistance load circuit 240 is set to a lowest level where the memory cell MC in region C is selected, since the voltage drop due to the parasitic resistance of the lines is greatest in this case. Conversely, the resistance value of the resistor inserted by the resistance load circuit 240 is set to a highest level where the memory cell MC in region A is selected, since the voltage drop due to the parasitic resistance of the lines is least in this case. Furthermore, even among memory cells MC in the same region, a reduced voltage drop due to the parasitic resistance is anticipated at commencement of the resetting when k (n>k) bits are subject to resetting, and a level of the voltage Vwldrv is therefore controlled by the number of memory cells MC on which the operation is simultaneously executed. Setting the resistance value of the resistor and the potential of the node wldrv in this way allows the word line potential of the selected memory cell portion to be made substantially identical independent of the position of the selected memory cells and the number of memory cells simultaneously operated on.

When a state of the m memory cells MC in region C changes from the low-resistance state to the high-resistance state prior to the remaining (n-m) memory cells MC in region C before the end of the resetting operation time T_reset shown in FIG. 10A, a voltage of the selected bit line BL connected to the m memory cells MC changes as shown in [Selected BL fast]of FIG. 10A. When the memory cell MC change from the low-resistance state to the high-resistance state, a current flowing in the memory cell MC is reduced and the effect of the parasitic resistance from the signal line DSA to the bit line BL is reduced, whereby a voltage applied to the memory cell MC increases. Moreover, since a current flowing into the selected word line decreases, the voltage drop in the current path lessens, whereby a rise in the potential of the selected word line WL also lessens. Consequently, on completion of a change in the resistance state, the potential of the selected bit line BL and the selected word line WL change as shown in FIG. 10A. On the other hand, for the remaining (n-m) memory cells MC, the resetting operation is continued until the certain resetting operation time T_reset elapses.

At time rs2, the signal RESET_P is set to "L", thereby completing resetting voltage application operations to the bit line. Subsequently, at time rs3, the unselected word line WL is discharged.

(Advantages of the Semiconductor Memory Device in Accordance with the Second Embodiment)

In the resistive memory device in accordance with the present embodiment, since the voltage Vf_n and the voltage Vn_n of ends on the word line side of the n memory cells MC(far bit) in region C and the n memory cells MC(near bit) in region A are substantially the same, a difference in the applied voltage caused by the parasitic resistance of the lines can be reduced. It is thereby possible to match operational conditions for the selected memory cells on which the resetting operation is executed.

Moreover, even in the case where the resetting operation is executed in the same region C, the voltage Vwldrv applied to the node wldrv is adjusted according to the number of selected memory cells MC on which the resetting operation is executed. Even in the case where the number of selected memory cells in the resetting operation in the same region C differs, since the voltage Vf_n and the voltage Vf_k of ends on the word line side are substantially the same, a difference in the applied voltage caused by the parasitic resistance of the lines can be reduced.

The selected word line voltage control circuit 200 and the resistance load circuit 240 set the potential of the node wldrv such that, whatever change occurs in the position of the selected memory cells MC within the memory cell array 100 and in the number of memory cells on which the operation is simultaneously executed, the voltage (Vf_n, Vf_k, Vn_n, Vn_k) at the connection between the word line WL and the memory cell MC is substantially the same. If the voltage (Vf_n, Vf_k, Vn_n, Vn_k) at the connection between the word line WL and the memory cell MC is substantially the same, the voltage applied to the selected memory cell MC during the resetting operation is constant whatever the selected memory cell MC. Since the resistive memory device in accordance with the present embodiment includes a function whereby differences in operational conditions arising from differences in the position of the selected memory cell and number of simultaneously selected memory cells during the resetting operation are controlled to be small, any memory cell can be operated on under appropriate conditions.

In the resistive memory device in accordance with the present embodiment, when the m memory cells MC are changed from the low-resistance state to the high-resistance state, the reduction in the voltage drop causes a reduction in the potential rise in the selected word line WL. Here, a magnitude of the reduction in the potential of the selected word line WL(far bit) in region C and a magnitude of the reduction in the potential of the selected word line WL(near bit) in region A are substantially similar. By contrast, a magnitude of the reduction in the potential of the selected word line WL(far bit) and a magnitude of the reduction in the potential of the selected word line WL(near bit) in the first embodiment shown in FIG. 8A are different.

This is caused by the fact that, in the first embodiment, the voltage applied to the node wldrv differs for the resetting operation on the memory cells MC in region C and the resetting operation on the memory cells MC in region A. The potential of the selected word line WL(far bit) in region C decreases as the number of memory cells which have undergone transition of state increases, finally falling to the potential of Vwldrv_f_n. However, the potential of the selected word line WL(near bit) in region A falls only as far as the potential of Vwldrv_n_n, even if the number of memory cells which have completed the resetting and undergone transition to the high-resistance state increases.

On the other hand, in the present embodiment, if the number of memory cells MC simultaneously operated on is the same, the voltage applied to the node wldrv has the same value regardless of the region where the memory cells are disposed. Moreover, the resistance of the current path from the selected memory cell to the selected word line voltage control circuit is adjusted by the resistance load circuit to be substantially the same value so as to minimize positional dependency of the selected memory cell. Consequently, voltages Vf_n-m and Vn_n-m have substantially identical values, even after m of the n memory cells MC have changed to the resetting state. In the resistive memory device of the present embodiment, it is possible to match operational conditions for the selected memory cells on which the operation is executed, even if the memory cells MC complete transition of state during the course of the resetting operation.

This concludes description of embodiments of the nonvolatile semiconductor memory device in accordance with the present invention, but it should be noted that the present invention is not limited to the above-described embodiments, and that various alterations, additions, and so on, are possible within a range not departing from the scope and spirit of the invention. For example, although the resetting operation was used to describe operation of the resistive memory device in the embodiments, a setting operation and a read operation effected not by changing the voltage-application state to the bit line and the word line, but by changing a value of the applied voltage, may also be used.

An embodiment in the read operation is described. For example, when 8 memory cells must be simultaneously read, a bit line voltage necessary and sufficient to enable read of the memory cell MC in a certain state and lying most distant from the word line control circuit is applied to the selected bit line. This bit line voltage is set so as to account for a voltage drop due to the cell current in a plurality of selected memory cells lying in a position within the memory cell array least conducive to current flow, and is therefore set high. Consequently, there is a possibility that an unnecessarily high bit line voltage is applied to the memory cell lying in a position within the memory cell array most conducive to current flow, and a risk that, if the cell current at this time is too large, the resetting operation is incorrectly caused. This results from a difference in the voltage drop in the current path of the selected memory cell, which, as previously mentioned, depends on the resistance of the current path which may change according to the position of the selected memory cell and on the number of memory cells in which the voltage drop-contributing cell current flows. Although the read operation differs from the resetting operation in that no operation passing a certain cell current in advance to count the number of memory cells is performed (since such an operation is itself a read operation), matching the resistance value of the current path on the basis of positional information of the selected memory cell in the read operation is a possible and effective method. Consequently, positional dependency of the selected memory cell during the read operation can be reduced by causing the resistance load circuit 240 to function on the basis of address information of the selected memory cell as shown in the second embodiment. In this case, the selected word line voltage control circuit 200 may have a common operational setting.

Moreover, in the setting operation, if it is assumed that a setting operation is not performed on a memory cell in a set state (low-resistance state), no current flows in the word line in the initial state when a pulse is applied, and there is thus neither a positional dependency of the selected memory cell nor a difference due to the number of simultaneously selected memory cells. However, when the setting operation is completed and the memory cell has changed from the high-resistance to the low-resistance state, current flows based on that memory cell, and the potential of the selected word line becomes fluctuating. It is desirable that effects of this fluctuation in the selected word line potential are not subject to positional dependency of the selected memory cell. Consequently, causing the resistance load circuit 240 to function such that the resistance of the current path is substantially equal whatever the position of the memory cell selected is also effective in the setting operation.

What is claimed is:

1. A semiconductor memory device, comprising:
a memory cell array having memory cells disposed at a crossing-point of a plurality of first lines and a plurality of second lines, each of the memory cells being configured by a rectifier and a variable resistor connected in series; and
a control circuit configured to apply a first voltage to selected one or more of the first lines, and to apply a second voltage having a value smaller than the first voltage to selected one of the second lines, such that a certain potential difference is applied to selected one or more of the memory cells disposed at respective the crossing-points of the selected one or more of the first lines and the selected one of the second lines,
the control circuit adjusting the second voltage based on a position of the selected one or more of the memory cells within the memory cell array and a number of the selected one or more of the memory cells on which an operation is simultaneously executed, during application of the potential difference to the selected one or more of the memory cells.

2. The semiconductor memory device according to claim 1, wherein the control circuit adjusts the second voltage such that a voltage applied to an end of the selected one of the memory cells connected to the selected one of the second lines is substantially the same irrespective of the position and the number of the selected one or more of the memory cells.

3. The semiconductor memory device according to claim 1, wherein the control circuit makes the value of the second voltage smaller as the position of the selected one or more of the memory cells within the memory cell array is distant from the control circuit.

4. The semiconductor memory device according to claim 1, wherein the control circuit makes the value of the second voltage smaller as the number of the selected one or more of the memory cells on which the operation is simultaneously executed increases.

5. The semiconductor memory device according to claim 1, wherein the control circuit comprises a data read circuit configured to read a resistance state of the selected one or more of the memory cells prior to application of the first voltage and the second voltage.

6. The semiconductor memory device according to claim 5, wherein the control circuit further comprises a counter configured to count the number of the selected one or more of the memory cells on which the operation is to be simultaneously executed, based on a read result of the data read circuit.

7. The semiconductor memory device according to claim 6, wherein the control circuit further comprises:
a reference voltage generating circuit configured to receive a count result of the counter and an address signal indicating the position of the selected one or more of the memory cells within the memory cell array, and to generate a reference voltage of a certain value based on the count result and the address signal; and
a second line voltage control circuit configured to receive the reference voltage, and to adjust the value of the second voltage based on the reference voltage to apply the adjusted value of the second voltage to the selected one or more of the second lines.

8. The semiconductor memory device according to claim 1,
wherein the variable resistor has at least two resistance states of a low-resistance state and a high-resistance state, and
wherein the variable resistor in the selected one or more of the memory cells transitions from the low-resistance state to the high-resistance state by the certain potential difference.

9. A semiconductor memory device, comprising:
a memory cell array having memory cells disposed at a crossing-point of a plurality of first lines and a plurality of second lines, each of the memory cells being configured by a rectifier and a variable resistor connected in series; and
a control circuit configured to apply a first voltage to selected one or more of the first lines, and to apply a second voltage having a value smaller than the first voltage to selected one of the second lines, such that a certain potential difference is applied to selected one or more of the memory cells disposed at respective the crossing-points of the selected one or more of the first lines and the selected one of the second lines,
the control circuit adjusting the second voltage based on a number of the selected one or more of the memory cells on which an operation is simultaneously executed, during application of the potential difference to the selected one or more of the memory cells.

10. The semiconductor memory device according to claim 9,
wherein the control circuit further comprises a resistance circuit configured to take a resistance value which differs according to a position of the selected one or more of the memory cells within the memory cell array, and
wherein the control circuit applies the second voltage to the second lines via the resistance circuit.

11. The semiconductor memory device according to claim 10,
wherein the resistance circuit comprises a plurality of resistors having different resistance values, and
wherein the resistance circuit inserts one or more of the resistors based on an address signal indicating the position of the selected one or more of the memory cells within the memory cell array such that a resistance value from the control circuit to the selected one or more of the memory cells is substantially the same irrespective of the position of the selected one or more of the memory cells.

12. The semiconductor memory device according to claim 10,
wherein the control circuit adjusts the second voltage such that a voltage applied to an end of the selected one of the memory cells connected to the selected one of the second lines via the resistance circuit is substantially the same irrespective of the number of the selected one or more of the memory cells.

13. The semiconductor memory device according to claim 9,
wherein the control circuit makes the value of the second voltage smaller as the number of the selected one or more of the memory cells on which the operation is simultaneously executed increases.

14. The semiconductor memory device according to claim 9,
wherein the control circuit comprises a data read circuit configured to read a resistance state of the selected one or more of the memory cells prior to application of the first voltage and the second voltage.

15. The semiconductor memory device according to claim 14,
wherein the control circuit further comprises a counter configured to count the number of the selected one or more of the memory cells on which the operation is to be simultaneously executed, based on a read result of the data read circuit.

16. The semiconductor memory device according to claim 15,
wherein the control circuit further comprises:
a reference voltage generating circuit configured to receive a count result of the counter, and to generate a reference voltage of a certain value based on the count result; and
a second line voltage control circuit configured to receive the reference voltage, and to adjust the value of the second voltage based on the reference voltage to apply the adjusted value of the second voltage to the selected one or more of the second lines.

17. The semiconductor memory device according to claim 9,
wherein the variable resistor has at least two resistance states of a low-resistance state and a high-resistance state, and
wherein the variable resistor in the selected one or more of the memory cells transitions from the low-resistance state to the high-resistance state by the certain potential difference.

18. A semiconductor memory device, comprising:
a memory cell array having memory cells disposed at a crossing-point of a plurality of first lines and a plurality of second lines, each of the memory cells being configured by a rectifier and a variable resistor connected in series; and
a control circuit configured to apply a first voltage to selected one or more of the first lines, and to apply a second voltage having a value smaller than the first voltage to selected one of the second lines, such that a certain potential difference is applied to selected one or more of the memory cells disposed at respective the crossing-points of the selected one or more of the first lines and the selected one of the second lines,
the control circuit further comprising a resistance circuit configured to take a resistance value which differs according to a position of the selected one or more of the memory cells within the memory cell array, and
the control circuit applying the second voltage to the second lines via the resistance circuit, during application of the potential difference to the selected one or more of the memory cells.

19. The semiconductor memory device according to claim 18,
wherein the resistance circuit comprises a plurality of resistors having different resistance values, and
wherein the resistance circuit inserts one or more of the resistors based on an address signal indicating the position of the selected one or more of the memory cells within the memory cell array such that a resistance value from the control circuit to the selected one or more of the memory cells is substantially the same irrespective of the position of the selected one or more of the memory cells.

20. The semiconductor memory device according to claim 18,
wherein the variable resistor has at least two resistance states of a low-resistance state and a high-resistance state, and wherein the control circuit executes any of a resetting operation configured to cause the variable resistor in the selected one or more of the memory cells to transition from the low-resistance state to the high-resistance state, a setting operation configured to cause the variable resistor in the selected one or more of the memory cells to transition from the high-resistance state to the low-resistance state, and a read operation configured to detect the resistance state of the variable resistor in the selected one or more of the memory cells, by application of the first voltage and the second voltage.

* * * * *